(12) United States Patent
Ridgeway et al.

(10) Patent No.: US 10,319,862 B2
(45) Date of Patent: Jun. 11, 2019

(54) BARRIER MATERIALS FOR DISPLAY DEVICES

(71) Applicant: AIR PRODUCTS AND CHEMICALS, INC., Allentown, PA (US)

(72) Inventors: Robert Gordon Ridgeway, Quakertown, PA (US); Andrew David Johnson, Doylestown, PA (US); Anupama Mallikarjunan, Macungie, PA (US); Raymond Nicholas Vrtis, Orefield, PA (US); Xinjian Lei, Vista, CA (US); Mark Leonard O'Neill, Gilbert, AZ (US); Manchao Xiao, San Diego, CA (US); Jianheng Li, Emmaus, PA (US); Michael T. Savo, Bethlehem, PA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 119 days.

(21) Appl. No.: 14/383,723

(22) PCT Filed: Mar. 8, 2013

(86) PCT No.: PCT/US2013/029914
§ 371 (c)(1),
(2) Date: Sep. 8, 2014

(87) PCT Pub. No.: WO2013/134661
PCT Pub. Date: Sep. 12, 2013

(65) Prior Publication Data
US 2015/0021599 A1    Jan. 22, 2015

Related U.S. Application Data

(60) Provisional application No. 61/609,045, filed on Mar. 9, 2012.

(51) Int. Cl.
C23C 16/34    (2006.01)
C23C 16/40    (2006.01)
(Continued)

(52) U.S. Cl.
CPC ...... H01L 29/78693 (2013.01); C23C 16/345 (2013.01); C23C 16/402 (2013.01);
(Continued)

(58) Field of Classification Search
CPC .. C23C 16/345; C23C 16/402; H01L 21/0214
(Continued)

(56) References Cited

U.S. PATENT DOCUMENTS 4,992,299 A    2/1991   Hochberg et al.
6,391,803 B1   5/2002   Kim et al.
(Continued)

FOREIGN PATENT DOCUMENTS

CN   1392288   1/2003
CN   1940132   4/2007
(Continued)

OTHER PUBLICATIONS

Chatham et al. Low-Temperature Deposition of Silicon Dioxide and Silicon Nitride for Dual Spacer Application, 2007, IEEE/SEMI Advanced Semiconductor Manufacturing Conference, pp. 181-183.*
(Continued)

*Primary Examiner* — Kelly M Gambetta
(74) *Attorney, Agent, or Firm* — Joseph D. Rossi

(57) ABSTRACT

Described herein are apparatus comprising one or more silicon-containing layers and a metal oxide layer. Also described herein are methods for forming one or more silicon-containing layers to be used, for example, as passivation layers in a display device. In one particular aspect, the apparatus comprises a transparent metal oxide layer, a
(Continued)

silicon oxide layer and a silicon nitride layer. In this or other aspects, the apparatus is deposited at a temperature of 350° C. or below. The silicon-containing layers described herein comprise one or more of the following properties: a density of about 1.9 g/cm$^3$ or greater; a hydrogen content of about $4 \times 10^{22}$ cm$^{-3}$ or less, and a transparency of about 90% or greater at 400-700 nm as measured by a UV-visible light spectrometer.

10 Claims, 9 Drawing Sheets

(51) Int. Cl.
    *H01L 29/786*      (2006.01)
    *H01L 21/02*      (2006.01)
    *H01L 29/24*      (2006.01)
    *H01L 29/66*      (2006.01)

(52) U.S. Cl.
    CPC .... *H01L 21/0217* (2013.01); *H01L 21/02565* (2013.01); *H01L 29/247* (2013.01); *H01L 29/6675* (2013.01)

(58) Field of Classification Search
    USPC ............................................. 427/569, 248.1
    See application file for complete search history.

(56) References Cited

U.S. PATENT DOCUMENTS

| | | | |
|---|---|---|---|
| 2003/0047785 A1 | 3/2003 | Kawasaki et al. | |
| 2006/0286775 A1 | 12/2006 | Singh et al. | |
| 2007/0164666 A1 | 7/2007 | Oosono et al. | |
| 2009/0104791 A1 | 4/2009 | Nemani et al. | |
| 2009/0232985 A1* | 9/2009 | Dussarrat | C23C 16/402 427/255.28 |
| 2010/0059756 A1 | 3/2010 | Park et al. | |
| 2010/0065841 A1 | 3/2010 | Lee et al. | |
| 2010/0144162 A1 | 6/2010 | Lee et al. | |
| 2011/0074282 A1* | 3/2011 | Bright | C23C 16/0272 313/504 |
| 2011/0114940 A1 | 5/2011 | Kim et al. | |
| 2011/0114941 A1 | 5/2011 | Kato et al. | |
| 2011/0136347 A1* | 6/2011 | Kovarsky | C01B 21/087 438/758 |
| 2011/0223765 A1* | 9/2011 | Rajagopalan | C23C 16/345 438/694 |
| 2011/0227193 A1 | 9/2011 | Makiyama | |
| 2012/0024963 A1 | 2/2012 | Shionoiri et al. | |
| 2012/0032227 A1* | 2/2012 | Seabaugh | H01L 29/7391 257/105 |
| 2012/0034451 A1 | 2/2012 | Seo et al. | |
| 2012/0045904 A1 | 2/2012 | Choi | |
| 2012/0058282 A1* | 3/2012 | Hong | C23C 16/045 427/579 |

FOREIGN PATENT DOCUMENTS

| | | |
|---|---|---|
| CN | 102191479 | 9/2011 |
| EP | 1630249 A2 | 1/2006 |
| EP | 2346082 A1 | 7/2011 |
| JP | 04063278 | 2/1992 |
| JP | 05102040 | 4/1993 |
| JP | 06084804 | 3/1994 |
| JP | 06084888 | 3/1994 |
| JP | 06097158 | 4/1994 |
| JP | 06338497 | 6/1994 |
| JP | 10060655 | 3/1998 |
| JP | 2007142066 | 6/2007 |
| JP | 2007171932 A2 | 7/2007 |
| JP | 2007220646 A | 8/2007 |
| JP | 2009141002 | 6/2009 |
| JP | 2010045395 | 2/2010 |
| JP | 2011054968 | 3/2011 |
| JP | 2011124563 | 6/2011 |
| JP | 211146713 A2 | 7/2011 |
| JP | 2011199062 | 10/2011 |
| JP | 2011527121 | 10/2011 |
| KR | 1020090033200 | 4/2009 |
| KR | 20100123889 A | 11/2010 |
| KR | 1020120012891 | 2/2012 |
| WO | 2004009861 A2 | 1/2004 |
| WO | 2006097525 A2 | 9/2006 |
| WO | 2008057394 A1 | 5/2008 |
| WO | 2009072532 | 6/2009 |
| WO | 2010002807 | 1/2010 |
| WO | 2012063614 | 5/2012 |

OTHER PUBLICATIONS

K. Chung, et al, "The Effect of Oxide and Nitride Passivation on the Behavior of In—Ga—Zn—O Thin-Film Transistors under Negative and Positive Bias Illumination Stress: A Photo-excited Charge Collection Spectroscopic Analysis", Journal of the Korean Physical Society, 2011, 3376-3379.

G. N. Parsons, et al., "Low hydrogen content stoichiometric silicon nitride films deposited by plasmaenhanced chemical vapor deposition", Journal of Applied Physics, vol. 70, No. 3, Jan. 1, 1991, pp. 1553-1560.

M. Blech, et al., "Detailed Study of PECVD Silicon Nitride and Coorelation of Various Characterization Techniques", 24th European Photovoltaic Solar Energy Conference, Sep. 21-25, 2009, pp. 507-511.

* cited by examiner

BARRIER MATERIALS FOR DISPLAY DEVICES

CROSS REFERENCE TO RELATED APPLICATIONS

This patent application claims the priority benefit of prior U.S. Provisional Patent Application Ser. No. 61/609,045 filed Mar. 9, 2012.

BACKGROUND OF THE INVENTION

Display devices have been in production for a wide range of electronic applications, such as flat screen televisions (TV), flat monitors, mobile phone, MP3 players, electronic book or eBook readers, and personal digital assistants (PDAs) and the like. The display devices are designed for producing a desired image by applying an electric field to a liquid crystal that fills a gap between two substrates and has an anisotropic dielectric constant that controls the intensity of the dielectric field. By adjusting the amount of light transmitted through the substrates, the light and image intensity, image quality, and/or power consumption may be efficiently controlled.

Thin film transistors (TFTs) for flat panel displays benefit from a lower processing temperature (e.g., 350° C. or below) so that alternative substrates that are lighter and less expensive than the presently used substrate or glass can be used. Various display devices, such as active matrix liquid crystal display (AMLCD) or an active matrix organic light emitting diodes (AMOLED), can be employed as light sources for display devices which use touch screen panels. Amorphous oxide semiconductors (AOS), transparent amorphous oxide semiconductor (TAOS) or metal oxide materials are fast emerging as replacement materials for TFTs that provides higher performance than glass be improving the device's electrical performance and are processable at lower temperatures. Examples of AOS, transparent amorphous oxide semiconductor (TAOS) or metal oxide materials that are being considered as replacements for TFTs include Indium Gallium Zinc Oxide (IGZO), a-IGZO (amorphous gallium indium zinc oxide), Indium Tin Zinc Oxide (ITZO), Aluminum Indium Oxide (AlInOx), Zinc Tin Oxide (ZTO), Zinc Oxynitride (ZnON), Magnesium Zinc Oxide, zinc oxide (ZnO) and variations thereof. Despite their advantages over traditional materials, these materials have a temperature processing limitation of about 350° C. or less. Further, these films may be deposited onto plastic substrates which lower their temperature processing limitation to about 200° C. Additionally, certain AOS, TAOS, or metal oxide materials may be damaged by the presence of hydrogen atoms in adjacent passivation, gate insulating layers, or both by reacting with the transparent amorphous oxide semiconductor (TAOS) or metal oxide materials, thereby resulting in current leakage or other types of device failure.

The reference "Influence of Passivation Layers on Characteristics of a-InGaZnO Thin-Film Transistors", Liu et al., Electron Device Letters, IEEE, Vol. 32(2), (20110, pp. 161-63 ("Liu et al."), investigated the effect of deposition conditions of a dual passivation layer consisting of silicon oxide and silicon nitride atop on the threshold voltage (Vt) of the a-InGaZnO TFT. The test structure used in Liu et al. consisted of a p-type silicon wafer which had a silicon substrate that served as the gate electrode, a 200 nanometer (nm) thick thermally grown silicon dioxide layer which acted as the gate insulator layer, a 45 nm thick source/drawn (Al) electrodes adjacent a 50 nm thick a-IGZO channel layer. The Al electrodes and a-IGZO layer was topped with a dual passivation layer consisting of a 30 nm silicon oxide layer and a 180 nm thick silicon nitride layer. The silicon oxide and silicon nitride films were deposited by plasma enhanced chemical vapor deposition (PECVD) at 200° C. using $SiH_4/N_2O/N_2$ and 250° C. using $SiH_4/NH_3/N_2$, respectively. The threshold voltage (VT) of the TFTs shifted markedly as a result of the mechanical stress induced by the passivation layers above. By adjusting the deposition parameters of the silicon nitride top layer during the passivation process, the performance of the TFTs can be modulated. The optimized a-InGaZnO TFTs after dual passivation exhibited the following characteristics: a field-effect mobility of 11.35 $cm^2/V \cdot s$, a threshold voltage of 2.86 V, a subthreshold swing of 0.5V, and an on-off ratio of $10^8$.

The reference "Impact of Hydrogenation of ZnO TFTs by Plasma-Deposited Silicon Nitride Gate Dielectric", Remashan et al., IEEE Transactions on Electronic Devices, Vol. 55, No. 10 (October 2008), pp. 2736-43, describes the effects of depositing by PECVD a silicon nitride layer having variable refractive indices for use as a gate dielectric layer on a zinc oxide (ZnO) TFT with a bottom gate configuration. The authors stated that hydrogenation is one of the methods in which performance of ZnO TFTs can be improved because hydrogen acts as a defect passivator and a shallow n-type dopant in ZnO materials. In Remashan et al., the four silicon nitride films were deposited via PECVD at a pressure of 650 mTorr, temperature of 300° C., and power of 30 W but using different molar ratios of silane relative to ammonia and nitrogen to provide silicon nitride films having different refractive indices (e.g., 2.39, 2.26, 1.92, and 1.80) and dielectric constants (7.9, 8.4, 6.7, and 6.1). The authors found that the amongst all of the TFTs, the device having the highest refractive index silicon nitride film or SiN_2.39 exhibited the best performance in terms of field-effect mobility, subthreshold slope, and maximum interface state density. An analysis of the secondary ion mass spectroscopy (SIMS) data showed that the amount of hydrogen present at the ZnO/insulator interface and in the ZnO channels for the TFT structures using a SiN_2.39 was much higher than those structures using a SiN_1.80. Therefore, the authors have concluded that the enhanced performance of the TFTs using the SiN_2.39 films is attributed to the incorporation of hydrogen into the ZnO channel and ZnO/insulator interface from the SiN_2.39.

The reference "Circuits Using Uniform TFTs Based on Amorphous In—Ga—Zn—O", Ryo Hayashi et al., Journal of the Society for Information Display, Vol. 15(11), 2007, pp. 915-92 discloses high-performance and excellent-uniformity thin-film transistors (TFTs) having bottom-gate structures fabricated using an amorphous indium-gallium-zinc-oxide (IGZO) film and an amorphous-silicon dioxide film as the channel layer and the gate insulator layer, respectively. All of the 94 TFTs fabricated with an area 1 $cm^2$ show almost identical transfer characteristics: the average saturation mobility is 14.6 $cm^2/(V\text{-sec})$ with a small standard deviation of 0.11 $cm^2/(V\text{-sec})$. A five-stage ring-oscillator composed of these TFTs operates at 410 kHz at an input voltage of 18 V. Pixel-driving circuits based on these TFTs are also fabricated with organic light-emitting diodes (OLED) which are monolithically integrated on the same substrate. It was demonstrated that light emission from the OLED cells can be switched and modulated by a 120-Hz ac signal input. Amorphous-IGZO-based TFTs are prominent candidates for building blocks of large-area OLED-display electronics.

The reference, "Stability and High-Frequency Operation of Amorphous In—Ga—Zn—O Thin-Film Transistors with Various Passivation Layers", Kenji Nomura et al., Thin Solid Films, doi:10.1016/j.tsf.2011.10.068 (2011), investigated the stability of amorphous In—Ga—Zn—O (a-IGZO) thin-film transistors (TFTs) focusing on the effects of passivation layer materials ($Y_2O_3$, $Al_2O_3$, $HfO_2$, and $SiO_2$) and thermal annealing. Positive bias constant current stress (CCS), negative bias stress without light illumination (NBS), and negative bias light illumination stress (NBLS) were examined. It was found that $Y_2O_3$ was the best passivation layer material in this study in terms of all the stability tests if the channel was annealed prior to the passivation formation (post-deposition annealing) and the passivation layer was annealed at 250° C. (post-fabrication annealing). Post-fabrication thermal annealing of the $Y_2O_3$ passivation layer produced very stable TFTs against the CCS and NBS stresses and eliminated sub gap photoresponse up to the photon energy of 2.9 eV. Even for NBLS with 2.7 eV photons, the threshold voltage shift is suppressed well to −4.4 V after 3 hours of testing. These results provide the following information; (i) passivation removes the surface deep subgap defects in a-IGZO and eliminates the subgap photoresponse, but (ii) the bulk defects in a-IGZO should be removed prior to the passivation process. The $Y_2O_3$-passivated TFT is not only stable for these stress conditions, but is also compatible with high-frequency operation with the current gain cut-off frequency of 91 kHz, which is consistent with the static characteristics.

US Publ. No. 2012/045904 ("the '904 Publ.") discloses methods of forming a hydrogen free silicon containing layer in TFT devices. The hydrogen free silicon containing layer may be used as a passivation layer, a gate dielectric layer, an etch stop layer, or other suitable layers in TFT devices, photodiodes, semiconductor diode, light-emitting diode (LED), or organic light-emitting diode (OLED), or other suitable display applications. In one embodiment, a method for forming a hydrogen free silicon containing layer in a thin film transistor includes supplying a gas mixture comprising a hydrogen free silicon containing gas and a reacting gas into a plasma enhanced chemical vapor deposition chamber, wherein the hydrogen free silicon containing gas is selected from a group consisting of $SiF_4$, $SiCl_4$, $Si_2Cl_6$, and forming a hydrogen free silicon containing layer on the substrate in the presence of the gas mixture.

US Publ. No. 2010/059756 ("'the 756 Publ.") disclose a thin film transistor (TFT). The TFT may include an intermediate layer between a channel and a source and drain. An increased off current which may occur to a drain area of the TFT is reduced due to the intermediate layer which is formed of amorphous silicon (a-Si), poly-Si, germanium (Ge), or silicon-germanium (SiGe).

Therefore, there is a need for a display device and method to manufacture same that provides one or more of the following advantages: good electrical properties meaning that it retains its semiconductive nature after processing; low processing temperatures (e.g., 350° C. or less) reduced hydrogen content; improved electrical performance; and long term stability.

BRIEF SUMMARY OF THE INVENTION

Described herein are apparatus comprising one or more silicon-containing layers and a transparent metal oxide. Also described herein are methods for forming one or more silicon-containing layers to be used, for example, as passivation layers in a display device.

The low temperature silicon-containing films have at one least one or more of the following properties: a density of about 1.9 grams per cubic centimeter ($g/cm^3$ or g/cc) or greater; a hydrogen content of $4 \times 10^{22}$ $cm^{-3}$ or less; a transparency of 90% or greater at 400-700 nm as measured by a UV-visible light spectrometer; and combinations thereof. In one particular embodiment, the silicon-containing film are silicon nitride or silicon oxynitride have at one least one or more of the following properties: a density of about 2.2 $g/cm^3$ or greater; a hydrogen content of about $4 \times 10^{22}$ $cm^{-3}$ or lower, and a transparency of about 90% or greater at 400-700 nm as measured by a UV-visible light spectrometer. In one aspect, there is provided an apparatus comprising: a substrate comprising a metal oxide layer; and a silicon nitride layer deposited onto at least a portion of the metal oxide wherein the silicon nitride layer comprises a density of about 2.4 $g/cm^3$ or greater and a hydrogen content of about $4 \times 10^{22}$ $cm^{-3}$ or less as measured by an analytical technique such as Fourier transform infrared spectroscopy (FT-IR), Rutherford Backscattering Spectrometry (RBS), or hydrogen forward scattering (HFS) or other method. In this or other embodiments, the silicon nitride layer has a transparency of about 90% or greater at 400-700 nanometers are measured by UV-visible light spectrometry.

In a further aspect, there is provided an apparatus comprising: a substrate comprising a metal oxide layer; a silicon nitride layer deposited onto at least a portion of the metal oxide wherein the silicon nitride layer comprises a density of about 2.4 $g/cm^3$ or greater, a hydrogen content of $4 \times 10^{22}$ $cm^{-3}$ or less, and a transparency of about 90% or greater at 400-700 nanometers are measured by UV-visible light spectrometry; and a silicon oxide layer deposited between the metal oxide layer and the silicon nitride layer wherein the silicon oxide layer comprises a density of about 2.2 $g/cm^3$ or greater.

In a still further aspect, there is provided a method for depositing a silicon-containing film on at least one surface of a substrate wherein the substrate comprises a metal oxide, the method comprising:

providing the at least one surface of the substrate in a reaction chamber; introducing into the reaction chamber a silicon precursor selected from the group consisting of:

a. trisilylamine (TSA);

b. a dialkylaminosilane having a formula of $R^1R^2NSiH_3$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ is independently selected from a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein $R^1$ and $R^2$ are linked to form a ring or $R^1$ and $R^2$ are not linked to form a ring;

c. an alkylsilane having a formula of $R^1_nR^2_mSiH_{4-m-n}$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ is independently selected from a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein $R^1$ and $R^2$ are linked to form a ring or $R^1$ and $R^2$ are not linked to form a ring; m is 0, 1, 2, 3, 4; and n is 1, 2, 3;

d. an alkylalkoxysilane having a formula of $R^1_n(OR^2)_m SiH_{4-m-n}$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ is independently selected from a $C_{1-10}$ linear or branched alkyl group; a $C_4$ to $C_{10}$ cyclic alkyl group; a $C_3$ to $C_{12}$ alkenyl group a $C_3$ to $C_{12}$ alkynyl group; and a $C_6$ to $C_{10}$ aryl group and wherein $R^1$ and $R^2$ are linked to form a ring or $R^1$ and $R^2$ are not linked to form a ring; m is 1, 2, 3, or 4; and n is 0, 1, 2 or 3;

e. an organoaminosilanes having a formula of $(R^1R^2N)_n$ $SiH^{4-n}$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ is independently selected from a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein $R^1$ and $R^2$ are linked to form a ring or Wand $R^2$ are not linked to form a ring; and n is 2, 3, or 4;

f. an isocyanatosilane selected from the group consisting of tetra(isocynato)silane and tri(isocynato)silane;

g. an alkylazidosilanes having the formula of $R^1R^2R^3SiN_3$ wherein $R^1$, $R^2$, and $R^3$ are independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group;

h. an alkylbridged disilanes having the formula of $(R^1R^2R^3Si)_2(CH_2)_n$, $R^1R^2R^3SiN_3$ wherein $R^1$, $R^2$, and $R^3$ are independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; and n=1, 2, 3;

i. an alkoxysilane having a formula of $Si(OR^1)_4$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; and combinations thereof;

introducing into the reaction chamber an source selected from an oxygen source, a nitrogen-containing source, or a combination thereof; and depositing via a vapor deposition process the thin silicon containing layer on the at least one surface of the substrate at one or more temperatures ranging from about 25° C. to 350° C.; wherein the vapor deposition process is selected from a group consisting of chemical vapor deposition (CVD), plasma enhanced chemical vapor deposition (PECVD), cyclic chemical vapor deposition (CCVD), plasma enhanced cyclic chemical vapor deposition (PECCVD, atomic layer deposition (ALD), and plasma enhanced atomic layer deposition (PEALD).

BRIEF DESCRIPTION OF SEVERAL VIEWS OF THE DRAWINGS

FIG. 1 shows that the highest density layers were obtained by the TSA precursors.

DETAILED DESCRIPTION OF THE INVENTION

Figure 1:
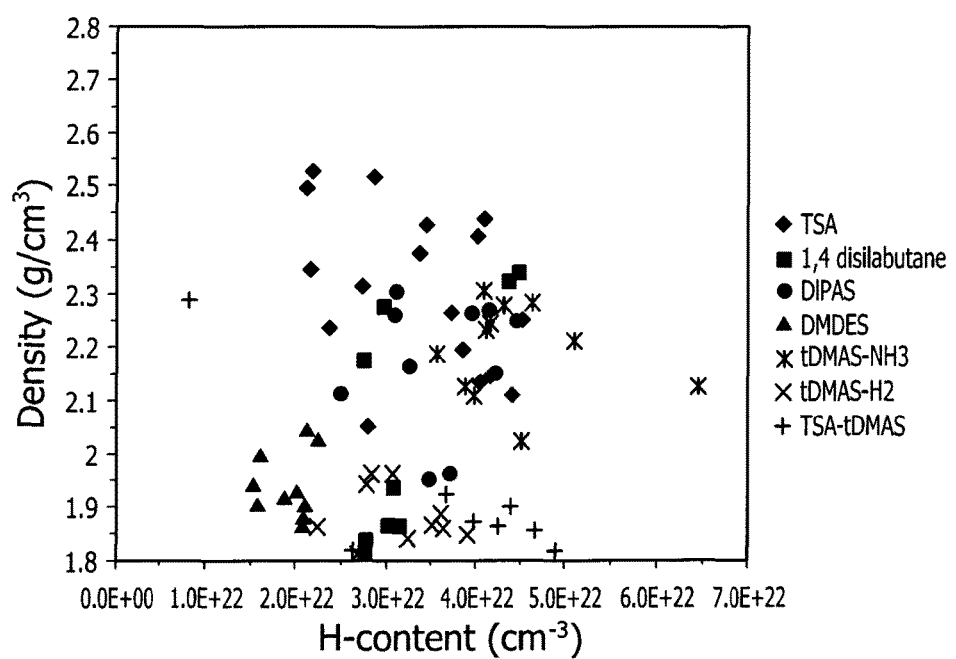
FIG. 1 shows the relationship between density (g/cm³) and hydrogen (H) content (as measured by XPS) for the various silicon-containing films deposited onto silicon substrates and provided in Examples 1 and Comparative Examples 2 through 7.

Apparatuses comprising transparent metal oxides such as, for example, IGZO-based TFTs, are being implemented for mobile displays. In one particular embodiment wherein the composition of the transparent metal oxide comprises IGZO, the thermal budget, which relates to the upper limit of the processing temperature that the apparatus can be subjected to, requires that one or more passivation films be deposited at one or more temperatures of 300° C. or below. In this or other embodiments, the one or more passivation layers provide good hermeticity, which is described herein as impervious to a fluid such as, without limitation a gas, a liquid or combinations thereof, by having a density of about 2.4 grams per cubic centimeter (g/cm³ or g/cc) or higher and a hydrogen content of $4 \times 10^{22}$ cm⁻³ or lower or $2 \times 10^{22}$ cm⁻³ or lower. The prior art describes dual layer structures wherein silane gas ($SiH_4$) is used to form SiN:H and $SiO_2$ films to passivate the a-Si TFTs underlying structure. While these SiN:H and $SiO_2$ films can be formed at temperatures below 300° C., the density and H-content of these films does not achieve the desired properties needed for passivating the underlying transparent metal oxide layer when deposited at temperatures below 300° C. In this regard, the desired properties for a silicon containing film that can be used as one or more passivation layers for a metal oxide layer in a display device comprise one or more of the following: a deposition temperature of about 350° C. or less; a density of about 2.4 g/cm$^3$ or higher, a hydrogen content of about $2 \times 10^{22}$ cm$^{-3}$ or lower, a transparency of about 90% from 400-700 nm as measured by UV-Vis Spectrometer; and combinations thereof.

Described herein is a method to deposit a silicon containing film that can be employed as one or more passivation layers for a display device which comprises at least one silicon-containing layer and at least one transparent metal oxide layer. The term passivation layer could mean, without limitation, a passivation layer, a gate dielectric layer, an etch stop layer, or other suitable layer in a display device such as a TFT device, a OLED device, a LED device or other display applications. The term silicon-containing films as used herein can mean a silicon, amorphous silicon, crystalline silicon, microcrystalline silicon, polycrystalline silicon, stoichiometric or non-stoichiometric silicon nitride, or non-stoichiometric silicon oxide, carbon doped silicon oxide, silicon carbonitride, and silicon oxynitride films. Of the foregoing, the one or more silicon-containing films are comprised of silicon oxide, silicon nitride, silicon oxynitride, silicon carboxide, and silicon carboxynitrde. The term "metal oxide" means one or more layers within the device that is suitable for use in a display device. In this regard, the metal oxide layer exhibits one or more the following properties: has requisite transparency for use in a display device, exhibits high electron mobility, and can be manufactured at low processing temperatures (e.g., 350° C. or below or 300° C. or below). Examples of metal oxides include but are not limited to, Indium Gallium Zinc Oxide (IGZO), a-IGZO (amorphous indium gallium zinc oxide), Indium Tin Zinc Oxide (ITZO), Aluminum Indium Oxide (AlInOx), Zinc Tin Oxide (ZTO), Zinc Oxynitride (ZnON), Magnesium Zinc Oxide, zinc oxide (ZnO), InGaZnON, ZnON, ZnSnO, CdSnO, GaSnO, TiSnO, CuAlO, SrCuo, LaCuOS, GaN, InGaN, AlGaN or InGaAlN and combinations thereof.

In addition to the one or more passivation layers and metal oxide layer, the display device may further include, without limitation, gate insulation layers, gate electrode layer(s), source drain layer(s), and other layers. The apparatus and method described herein may be used to deposit the at least one silicon-containing and metal oxide layer onto at least a portion of a substrate. Examples of suitable substrates include but are not limited to, glass, plastics, stainless steel, organic or polymer films, silicon, SiO$_2$, Si$_3$N$_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper, aluminum, chromium, molybdenum and gate electrodes such as, but not limited to, TiN, Ti(C)N, TaN, Ta(C)N, Ta, W, WN, ITO or other gate electrodes. The silicon-containing films are compatible with a variety of subsequent processing steps such as, for example, chemical mechanical planarization (CMP) and anisotropic etching processes. In certain embodiments, the silicon-containing layer described herein has a dielectric constant of that ranges from about 4.0 to about 5.5 or from about 4.0 to about 4.5.

Figures 9A, 9B:
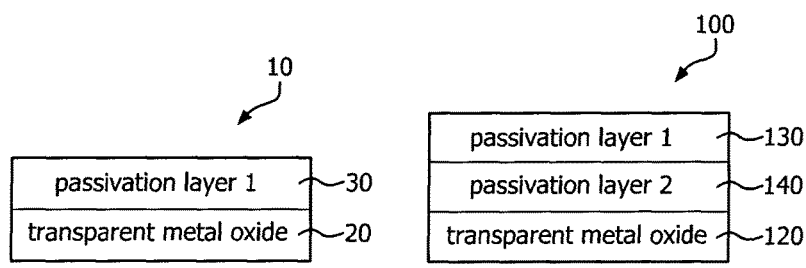
FIGS. 9a and 9b provide examples of the single passivation layer and double passivation layer embodiments of the apparatus described herein.

In one embodiment 10 of the apparatus described herein and shown in FIG. 9a, the silicon-containing film is deposited as a single passivation layer 30 onto at least a portion of a metal oxide 20 that can be use, for example, in a display device. In an alternative embodiment 100 of the apparatus described herein and shown in FIG. 9b, the silicon-containing film is deposited onto one or more silicon-containing films above the metal oxide layer 120 which is shown as passivation layer 2, or 140 on FIG. 9b, and passivation layer 1, or 130 on FIG. 9b, to provide a double passivation layer structure or multi-layered passivation layer structure. In one embodiment, the silicon-containing films in the double passivation or multi-layered are different types of silicon-containing films. Alternatively, the silicon-containing films in the double or multi-layered structures can be the same types of silicon-containing films but alternated in a variety of ways, such as without limitation, SixOy, SiwNz, SixOy, and SiwNz; SixOy, SixOy, and SiwNz; SixOy, SiwNz, and SiwNz; and various combinations thereof. While the exemplary structures shown in FIGS. 9a and 9b show the one or more passivation layers deposited onto at least a portion of the metal oxide film, it is understood that the one or more layers are not limited to arrangement of layers depicted in FIGS. 9a and 9b and may be above or below metal oxide layer and one or more passivation layer(s), sandwiched, imbedded, surrounded, have intervening layers which are not silicon-containing, or any other spatial relationships with respect to each other and are subsequently not limited thereto.

In one particular embodiment, the display device comprises at least two passivation layers deposited onto the metal oxide layer such as that shown in FIG. 9b wherein the passivation layers comprise: a silicon oxide or layer 140 as passivation layer 2 and a silicon nitride as layer 130 or passivation layer 1. In one particular embodiment of the apparatus shown in 9b, the metal oxide layer comprises IGZO and the at least two passivation layers act as a barrier to protect the IGZO film from diffusion of atmospheric impurities (e.g., be hermetic) while not impacting to any great significance the resistivity of the IGZO film post treatment. In this particular embodiment, the apparatus comprises a high density silicon nitride film (e.g., having a density of 2.4 g/cm$^3$ or greater) as passivation layer 1 and is deposited by the precursor trisilylamine (TSA) and ammonia (NH$_3$) at one or more temperatures that range from about 80° C. to about 400° C. The device further comprises a silicon oxide film as passivation layer 2 to prevent the diffusion of active hydrogen contained in the silicon nitride to the IGZO located beneath the oxide. The silicon oxide film can be deposited at one or more temperatures ranging from 80° C. to 400° C. It is desirable that the precursor selected and the deposition process conditions impart a minimum of hydrogen, hydroxyl groups, or other moieties such as carbon, hydrocarbons or other functional groups which can react with the metal oxide layer such as IGZO. In one particular embodiment, passivation layer 2 or 140 in FIG. 9b is a low temperature deposited (e.g., 300° C. or less) silicon oxide film which is deposited from triethylsilane, diethylsilane, or tetraethoxysilane and has one or more of the following properties: a thickness of about 2 nm to about 200 nm, a density of about 2.2 g/cm$^3$ or greater, and a hydrogen content of about 5 atomic percent or less. In this or other embodiments, the passivation layer 2 or 140 in FIG. 9b is deposited from a silicon-containing precursor which does not contain a Si—H group because it is known that Si—H may react with the metal oxide, thus damaging the electric property of the metal oxide layer. While not being bound to theory, for apparatus having two or more passivation layers comprising a silicon oxide and silicon nitride, the applicants believe that the selection of the silicon oxide precursor and its deposition parameters and the silicon nitride and its deposition parameters are important to ensure that the attributes of one or more passivation layers do not adversely impact the resistivity of the metal oxide layer.

In one particular embodiment, the apparatus of display device described herein comprises at least one passivation layer that is deposited using the precursor trisilylamine (TSA) and is a silicon nitride or a silicon oxynitride film. In this embodiment, the passivation layer is deposited using a PECVD process at a deposition temperature of 300° C. employing trisilylamine TSA and provides a film density of 2.5 g/cm$^3$ or greater and a hydrogen content of 2×10$^{22}$ cm$^{-3}$ or less. In a further embodiment, described herein is an apparatus comprising a TSA-deposited silicon nitride film which was deposited via PECVD at a even lower temperature deposition temperature or 200° C. and has a density of about 2.4 g/cm$^3$ or greater. In both of the above embodiments, the TSA-deposited silicon nitride films provide a transparency requirements of 90% transparency or greater from 400-700 nm as measured by UV-visible light spectrometer to be suitable for display device applications. Further, in both of these embodiments, the apparatus has at least one or more passivation layers that allows the metal oxide layer, such as a metal oxide layer comprising IGZO, to have a resistance that is semiconductive (e.g., having a resistance of from 1×10$^4$ to 1×10$^5$ Ohms/square (Ω/□)). The apparatus described herein retains this resistance range or remains semiconductive even after it has been exposed to high temperature and high humidity or 85° C. and 85% humidity cycles.

As previously mentioned, in addition to the silicon nitride passivation layer, in one embodiment of the apparatus described herein, the apparatus further comprises a silicon oxide layer. This silicon oxide layer, like the silicon nitride layer, has at least one or more of the following properties: a thickness of about 2 nm to about 200 nm, a density of about 2.2 g/cm$^3$ or greater, and a hydrogen content of about 5 atomic percent or less. In certain embodiments, the precursor used to deposit the silicon oxide film does not have a Si—H bond such as tetraalkoxysilane (TEOS).

The method used to form the one or more silicon-containing film(s) or layer(s) and the metal oxide layer(s) are referred to herein as a deposition process. Examples of suitable deposition processes for the method disclosed herein include, but are not limited to, chemical vapor depositions (CVD), cyclic CVD (CCVD), MOCVD (Metal Organic CVD), thermal chemical vapor deposition, plasma enhanced chemical vapor deposition ("PECVD"), high density PECVD, photon assisted CVD, plasma-photon assisted ("PPECVD"), cryogenic chemical vapor deposition, chemical assisted vapor deposition, hot-filament chemical vapor deposition, CVD of a liquid polymer precursor, deposition from supercritical fluids, and low energy CVD (LECVD). In certain embodiments, the films are deposited via atomic layer deposition (ALD), plasma enhanced ALD (PEALD) or plasma enhanced cyclic CVD (PECCVD) process. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous", it is understood that the precursors can be liquid or solid which are transported with or without an inert gas into the reactor via direct vaporization, bubbling or sublimation. In some case, the vaporized precursors can pass through a plasma generator. In one embodiment, the one or more films is deposited using an ALD process. In another embodiment, the one or more films is deposited using a CCVD process. In a further embodiment, the one or more films is deposited using a thermal CVD process. The term "reactor" as used herein, includes without limitation, reaction chamber or deposition chamber.

In certain embodiments, the method disclosed herein avoids pre-reaction of the precursors by using ALD or CCVD methods that separate the precursors prior to and/or during the introduction to the reactor. In this connection, deposition techniques such as ALD or CCVD processes are used to deposit the film. In one embodiment, the film is deposited via an ALD process by exposing the substrate surface alternatively to the one or more the silicon-containing precursor, oxygen source, nitrogen-containing source, or other precursor or reagent. Film growth proceeds by self-limiting control of surface reaction, the pulse length of each precursor or reagent, and the deposition temperature. However, once the surface of the substrate is saturated, the film growth ceases.

The silicon-containing precursors using for depositing the one or more silicon-containing films or layers are selected from the group consisting of:
  a. trisilylamine (TSA);
  b. a dialkylaminosilane having a formula of $R^1R^2NSiH_3$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ is independently selected from a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein $R^1$ and $R^2$ are linked to form a ring or $R^1$ and $R^2$ are not linked to form a ring;
  c. an alkylsilane having a formula of $R^{10}R^2{}_mSiH_{4-m-n}$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ is independently selected from a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein $R^1$ and $R^2$ are linked to form a ring or $R^1$ and $R^2$ are not linked to form a ring; m is 0, 1, 2, 3, 4; and n is 1, 2, 3;
  d. an alkylalkoxysilane having a formula of $R^1{}_n(OR^2)_m SiH_{4-m-n}$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ is independently selected from a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein $R^1$ and $R^2$ are linked to form a ring or $R^1$ and $R^2$ are not linked to form a ring; m is 1, 2, 3, or 4; and n is 0, 1, 2 or 3;
  e. an organoaminosilanes having a formula of $(R^1R^2N)_n SiH_{4-n}$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ is independently selected from a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein R¹ and R² are linked to form a ring or R¹ and R² are not linked to form a ring; and n is 2, 3, or 4;

f. an isocyanatosilane selected from the group consisting of tetra(isocynato)silane and tri(isocynato)silane;

g. an alkylazidosilanes having the formula of $R^1R^2R^3SiN_3$ wherein $R^1$, $R^2$, and $R^3$ are independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group;

h. an alkylbridged disilanes having the formula of $(R^1R^2R^3Si)_2(CH_2)_n$, $R^1R^2R^3SiN_3$ wherein $R^1$, $R^2$, and $R^3$ are independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; and n=1, 2, 3;

i. an alkoxysilane having a formula of $Si(OR^1)_4$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; and combinations thereof.

In another embodiment, the one or more silicon-containing layer(s) is deposited using a deposition process described herein from a composition comprising trisilylamine (TSA) and one or more of the silicon-containing precursors selected from the group consisting of:

a. a dialkylaminosilane having a formula of $R^1R^2NSiH_3$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ is independently selected from a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein $R^1$ and $R^2$ are linked to form a ring or $R^1$ and $R^2$ are not linked to form a ring;

b. an alkylsilane having a formula of $R^1_nR^2_mSiH_{4-m-n}$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ is independently selected from a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein $R^1$ and $R^2$ are linked to form a ring or $R^1$ and $R^2$ are not linked to form a ring; m is 0, 1, 2, 3, 4; and n is 1, 2, 3;

c. an alkylalkoxysilane having a formula of $R^1_n(OR^2)_mSiH_{4-m-n}$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ is independently selected from a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein $R^1$ and $R^2$ are linked to form a ring or $R^1$ and $R^2$ are not linked to form a ring; m is 1, 2, 3, or 4; and n is 0, 1, 2 or 3;

d. an organoaminosilanes having a formula of $(R^1R^2N)_nSiH_{4-n}$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ is independently selected from a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein $R^1$ and $R^2$ are linked to form a ring or $R^1$ and $R^2$ are not linked to form a ring; and n is 2, 3, or 4;

e. a halosilane selected from the group consisting of monchlorosilane, dichlorosilane, trichlorosilane, tetrachlorosilane, and hexachlorosilane;

f. an alkoxyaminosilane having a formula of $(R^1R^2)NSiR^3OR^4OR^5$; wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ and $R^3$ are independently selected from the group consisting of hydrogen, a $C_{1-10}$ linear or branched alkyl group; a $C_4$ to $C_{10}$ cyclic alkyl group; a $C_3$ to $C_{12}$ alkenyl group a $C_3$ to $C_{12}$ alkynyl group; and a $C_6$ to $C_{10}$ aryl group; $R^4$ and $R^5$ are independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; wherein $R^1$ and $R^2$ are linked to form a ring or $R^1$ and $R^2$ are not linked to form a ring; and wherein $R^4$ and $R^5$ are linked to form a ring or $R^4$ and $R^5$ are not linked to form a ring;

g. an isocyanatosilane selected from the group consisting of tetra(isocynato)silane and tri(isocynato)silane;

h. an alkylazidosilane having the formula of $R^1R^2R^3SiN_3$ wherein $R^1$, $R^2$, and $R^3$ are independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; and i. an alkylbridged disilane having the formula of $(R^1R^2R^3Si)_2(CH_2)_n$, $R^1R^2R^3SiN_3$ wherein $R^1$, $R^2$, and $R^3$ are independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; and n is 1, 2, or 3;

j. alkoxysilane having a formula of $Si(OR^1)_4$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; and combinations thereof.

In the above embodiments for the composition comprising trisilylamine and one or more silicon-containing precursor, the percentage of trisilylamine in the composition ranges from 0.5 to 99% depending whether the deposited silicon-containing film or passivation film can meet the requirements of targeted display devices. One preferred embodiment is a mixture of trisilylamine with di-iso-propylaminosilane which would allow the deposited films to be tuned to meet the application requirements. Another preferred embodiment is a mixture of trisilylamine with diethylsilane as both of which boiling point are close to each other and allow them to be mixed in liquid form and can be delivered via direct liquid injection.

Of the foregoing silicon-containing precursors, exemplary dialkylaminosilanes include, but not limited to, di-iso-propylaminosilane, di-sec-butylaminosilane, and 2,6-dimethylpiperidinosilane. Exemplary alkylsilanes include, but not limited to, are diethylsilane (2ES), di(tert-butyl)silane, di(iso-propyl)silane, di(sec-butyl)silane, di(iso-butyl)silane, di(tert-amyl)silane, triethylsilane (3ES), tri(tert-butyl)silane, tri(iso-propyl)silane, tri(sec-butyl)silane, tri(iso-butyl)silane, tri(tert-amyl)silane, tert-butyldiethylsilane, tert-butyldipropylsilane, diethylisopropylsilane, cyclopentylsilane, and phenylsilane. Exemplary alkylalkoxysilanes include, but not limited to, tetraethoxysilane (TEOS), diethoxydimethylsilane, and tetraethoxysilane. Exemplary organoaminosilanes include, but not limited to, tri(dimethylamino)silane, di-isopropylaminosilane, and bis(tert-butylamino)silane. Exemplary alkylazidosilane precursors include, but not limited to, $Me_3SiN_3$ and $Et_3SiN_3$. Exemplary alkyl-bridged silanes include, but not limited to, 1,4-disilabutane.

In the formulas above and throughout the description, the term "alkyl" denotes a linear, or branched functional group having from 1 to 10 or 1 to 4 carbon atoms. Exemplary alkyl groups include, but are not limited to, methyl, ethyl, n-propyl, isopropyl, n-butyl, isobutyl, sec-butyl, tert-butyl, n-pentyl, iso-pentyl, tert-pentyl, hexyl, isohexyl, and neohexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto.

In the formulas above and throughout the description, the term "cyclic alkyl" denotes a cyclic functional group having from 3 to 12 or from 4 to 10 carbon atoms. Exemplary cyclic alkyl groups include, but are not limited to, cyclobutyl, cyclopentyl, cyclohexyl, and cyclooctyl groups.

In the formulas above and throughout the description, the term "aryl" denotes an aromatic cyclic functional group having from 6 to 12 carbon atoms. Exemplary aryl groups include, but are not limited to, phenyl, benzyl, chlorobenzyl, tolyl, and o-xylyl.

In the formulas above and throughout the description, the term "alkenyl group" denotes a group which has one or more carbon-carbon double bonds and has from 2 to 12 or from 2 to 6 carbon atoms. Exemplary alkenyl groups include, but are not limited to, vinyl or allyl groups In the formulas above and throughout the description, the term "alkynyl group" denotes a group which has one or more carbon-carbon triple bonds and has from 2 to 12 or from 2 to 6 carbon atoms.

In the formulas above and throughout the description, the term "alkoxy" denotes an alkyl group which has is linked to an oxygen atom (e.g., R—O) and may have from 1 to 12, or from 1 to 6 carbon atoms. Exemplary alkoxy groups include, but are not limited to, methoxy (—$OCH_3$), ethoxy (—$OCH_2CH_3$), n-propoxy (—$OCH_2CH_2CH_3$), and iso-propoxy $OCHMe_2$).

In certain embodiments, one or more of the alkyl group, alkenyl group, alkynyl group, alkoxy group, and/or aryl group in the formulas above may be substituted or have one or more atoms or group of atoms substituted in place of, for example, a hydrogen atom. Exemplary substituents include, but are not limited to, oxygen, sulfur, halogen atoms (e.g., F, Cl, I, or Br), nitrogen, and phosphorous. In other embodiments, one or more of the alkyl group, alkenyl group, alkynyl group, alkoxy group, and/or aryl in the formula may be unsubstituted.

In certain embodiments, substituents $R^1$ and $R^2$ or substitutents $R^4$ and $R^5$ (if present) are linked in the above formulas are linked to form a ring structure. In certain embodiments, $R^1$ and $R^2$ and/or $R^4$ and $R^5$ (if present) in the above formulas can be linked together to form a ring. As the skilled person will understand, where $R^1$ and $R^2$ are linked together to form a ring $R^1$ will include a bond (instead of a hydrogen substituent) for linking to $R^2$ and vice versa. Thus, in the example above $R^1$ may be selected from a linear or branched $C_1$ to $C_{10}$ alkylene moiety; a $C_2$ to $C_{12}$ alkenylene moiety; a $C_2$ to $C_{12}$ alkynylene moiety; a $C_4$ to $C_{10}$ cyclic alkyl moiety; and a $C_6$ to $C_{10}$ arylene moiety. In these embodiments, the ring structure can be unsaturated such as, for example, a cyclic alkyl ring or saturated, for example, an aryl ring. In these embodiments, the ring structure can also be substituted or substituted. In other embodiments, substituent $R^1$ and $R^2$ and substituent $R^4$ and $R^5$ (if present) are not linked.

In certain embodiments, the silicon-containing film or layer deposited using the methods described herein are formed in the presence of oxygen using an oxygen source, reagent or precursor comprising oxygen. In one particular embodiment such as that depicted in FIG. 9b, the silicon-containing film 140 or passivation layer 2 comprises silicon oxide and is deposited using the methods described above are formed in the presence of oxygen using an oxygen source, reagent or precursor comprising oxygen. An oxygen source may be introduced into the reactor in the form of at least one oxygen source and/or may be present incidentally in the other precursors used in the deposition process. Suitable oxygen source gases may include, for example, water ($H_2O$) (e.g., deionized water, purifier water, and/or distilled water), oxygen ($O_2$), oxygen plasma, ozone ($O_3$), NO, $N_2O$, carbon monoxide (CO), carbon dioxide ($CO_2$) and combinations thereof. In certain embodiments, the oxygen source comprises an oxygen source gas that is introduced into the reactor at a flow rate ranging from about 1 to about 2000 square cubic centimeters (sccm) or from about 1 to about 1000 sccm. The oxygen source can be introduced for a time that ranges from about 0.1 to about 100 seconds. In one particular embodiment, the oxygen source comprises water having a temperature of 10° C. or greater. In embodiments wherein the film is deposited by an ALD or a cyclic CVD process, the precursor pulse can have a pulse duration that is greater than 0.01 seconds, and the oxygen source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between. The oxygen source or reagent is provided in a molecular amount less than a 1:1 ratio to the silicon precursor, so that at least some carbon is retained in the as deposited dielectric film.

In certain embodiments, the silicon-containing comprise silicon and nitrogen. In these embodiments, the silicon-containing deposited using the methods described herein are formed in the presence of nitrogen-containing source. In one particular embodiment such as that depicted in FIG. 9b, the silicon-containing film 130 or passivation layer 1 comprises silicon nitride and is deposited using the methods described above are formed in the presence of nitrogen using a nitrogen, reagent or precursor comprising nitrogen. A nitrogen-containing source may be introduced into the reactor in the form of at least one nitrogen source and/or may be present incidentally in the other precursors used in the deposition process. Suitable nitrogen-containing source gases may include, for example, ammonia, hydrazine, monoalkylhydrazine, dialkylhydrazine, nitrogen, nitrogen/hydrogen, ammonia plasma, nitrogen plasma, nitrogen/hydrogen plasma, $NF_3$ and mixture thereof. In one particular embodiment, $NF_3$ is used to reduce the hydrogen content in the resulting films because hydrogen can react with the metal oxide thereby adversely effecting the performance of the display devices. In certain embodiments, the nitrogen-containing source comprises an ammonia plasma or hydrogen/nitrogen plasma source gas that is introduced into the reactor at a flow rate ranging from about 1 to about 2000 square cubic centimeters (sccm) or from about 1 to about 1000 sccm. The nitrogen-containing source can be introduced for a time that ranges from about 0.1 to about 100 seconds. In embodiments wherein the film is deposited by an ALD or a cyclic CVD process, the precursor pulse can have a pulse duration that is greater than 0.01 seconds, and the nitrogen-containing source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon, hydrogen ($H_2$), and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

The respective step of supplying the precursors, oxygen source, the nitrogen-containing source, and/or other precursors, source gases, and/or reagents may be performed by changing the time for supplying them to change the stoichiometric composition of the resulting dielectric film.

Energy is applied to the at least one of the silicon-containing precursor, oxygen-containing source, nitrogen-containing source, reducing agent, other precursors and/or combination thereof to induce reaction and to form the silicon-containing film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The silicon-containing precursors may be delivered to the reaction chamber such as a CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

In certain embodiments, the gas lines connecting from the precursor canisters to the reaction chamber are heated to one or more temperatures depending upon the process requirements and the container of the at least one silicon-containing precursor is kept at one or more temperatures for bubbling.

In other embodiments, a solution comprising the at least one silicon-containing precursor is injected into a vaporizer kept at one or more temperatures for direct liquid injection.

In a typical ALD or CCVD process, the substrate such as a silicon oxide substrate is heated on a heater stage in a reaction chamber that is exposed to the silicon-containing precursor initially to allow the complex to chemically adsorb onto the surface of the substrate. A purge gas such as argon purges away unabsorbed excess complex from the process chamber. After sufficient purging, a nitrogen-containing source may be introduced into reaction chamber to react with the absorbed surface followed by another gas purge to remove reaction by-products from the chamber. The process cycle can be repeated to achieve the desired film thickness.

The rate of the deposition of the silicon-containing films can be in the range of 0.1 nm to 5000 nm per minute. The rate can be controlled by varying any one of the following non-limiting parameters: deposition temperature, the vaporizer temperature, the flow of the LFC, the flow rate of the reactive of $O_2$ gas and/or the pressure at the CVD reactor. Choice of precursor can also determine the deposition rate.

The resultant films or coatings may be exposed to a post-deposition treatment such as, but not limited to, a plasma treatment, chemical treatment, ultraviolet light exposure, electron beam exposure, and/or other treatments to affect one or more properties of the film.

In the method described herein, it is understood that the steps of the methods described herein may be performed in a variety of orders, may be performed sequentially or concurrently (e.g., during at least a portion of another step), and any combination thereof. The respective step of supplying the precursors and the nitrogen-containing source gases may be performed by varying the duration of the time for supplying them to change the stoichiometric composition of the resulting dielectric film.

In certain embodiments, passivation layers 1 and 2, shown in FIG. 9b as 130 and 140 respectively, are deposited using the same silicon-containing precursor. The silicon-containing films for passivation layer 1 comprise silicon and nitrogen which is formed in the presence of nitrogen-containing source. An nitrogen-containing source may be introduced into the reactor in the form of at least one nitrogen source and/or may be present incidentally in the other precursors used in the deposition process. The silicon-containing films for passivation layer 2 comprise silicon and oxygen which is deposited using the methods described above in the presence of oxygen using an oxygen source, reagent or precursor comprising oxygen.

In certain embodiments, it may be advantageous to deposit a gradiated layer or a bilayer which is gradiated from top to bottom comprising SiCO or $SiO_2$ at the bottom and a SiNC or $Si_3N_4$ at the top. In this embodiment, the gradiated layer is deposited from a first reagent mixture comprising a silicon containing precursor and a oxygen containing precursor, such as, trisilylamine and $O_2$, ozone, or $N_2O$, and then replacing the flow of the oxygen containing gas with an nitrogen containing gas, such as, $N_2$, ammonia, or hydrazine. If the silicon containing precursor already contains nitrogen then the second step may be performed using just an inert gas or hydrogen. The changing of the oxygen to nitrogen containing or inert gases can be gradual or abrupt resulting in either a gradiated layer or a bilayer structure. Such gradiated layer or a bilayer is advantageous as the SiOC layer protects the underlying layer from hydrogen generated during the deposition of the SiCN layer, while the SiCN layer acts as a moisture barrier in the final device. The silicon precursor for this embodiment would not contain oxygen as the oxygen from the precursor is difficult to prevent from incorporating into the SiCN or $Si_3N_4$ film.

The temperature of the reactor or deposition chamber for the deposition may range from one of the following end-points: ambient temperature 25° C.; 50° C.; 75° C.; 100° C.; 125° C.; 150° C.; 175° C.; 200° C.; 225° C.; 250° C.; 300° C.; 325° C.; 350° C.; 375° C.; 400° C.; and any combinations thereof. In this regard, the temperature of the reactor or deposition chamber for the deposition may range from ambient temperature 25° C. to about 400° C., 100° C. to 370° C., 150° C. to 325° C., or 100° C. to 300° C., or any combinations of the temperature end-points described herein.

The pressure of the reactor or deposition chamber may range from about 0.1 Torr to about 1000 Torr. The respective step of supplying the precursors, the oxygen source, and/or other precursors, source gases, and/or reagents may be performed by changing the time for supplying them to change the stoichiometric composition of the resulting dielectric film.

The following examples illustrate the method for preparing a dielectric film described herein and are not intended to limit it in any way.

EXAMPLES

General Deposition Conditions

The silicon containing films were deposited onto medium resistivity (8-12 Ωcm) single crystal silicon wafer substrates. In certain examples, the substrate may be exposed to a pre-deposition treatment such as, but not limited to, a plasma treatment, chemical treatment, ultraviolet light exposure, electron beam exposure, and/or other treatments to affect one or more properties of the film. For example, it may be advantageous b subject the IGZO film to a $N_2O$, $O_2$, or $O_3$ plasma treatment or an $O_3$ chemical treatment to ensure complete oxidation of the IGZO. This allows for the semi-conducting properties to be preserved or enhanced prior to film deposition.

All depositions were performed on an Applied Materials Precision 5000 system in a 200 mm DXZ chamber fitted with an Astron EX remote plasma generator, using either a silane or a TEOS process kit. The PECVD chamber is equipped with direct liquid injection delivery capability. With the exception of silane, all precursors were liquids with delivery temperatures dependent on the precursor's boiling point. Typical liquid precursor flow rates ranged from 100 to 800 mg/min, the plasma power density ranged from 0.75 to 2.5 W/cm², and the pressure range was from 0.75 to 8 torr. The thickness of the films and refractive index (RI) at 632 nm were measured by a reflectometer. Typical film thickness for all above analysis ranged from 100 to 1000 nm. In general, RI was not a sensitive indicator of film properties in this study. —Bonding properties of the silicon-containing were analyzed with a Nicolet transmission Fourier transform infrared spectroscopy (FTIR) tool. All density measurements were accomplished using X-ray reflectivity (XRR). X-ray Photoelectron Spectroscopy (XPS) and Rutherford Backscattering Spectrometry (RBS) were performed to determine the film composition. Wet etch rate (WER) was measured in a 10:1 Buffered Oxide Etch (BOE) solution. A mercury probe was utilized for all film measurements where dielectric constant, electrical leakage and breakdown field are presented. A Sinton WCT-120 Quasi Steady State Photoconductive Decay tool was used to measure minority carrier lifetimes in Float Zone High Resistivity Silicon with the minority carrier concentration of $5 \times 10^{14}$ and $1 \times 10^{15}$ $cm^{-3}$.

Silicon precursors were screened using a design of experiment (DOE) methodology summarized below: precursor flow from 100 to 800 mg/min; $NH_3$/He flow from 100 sccm to 1000 sccm, pressure from 0.75 to 8 torr; RF power (13.56 MHz) 400 to 1000 W; Low-frequency (LF) power 0 to 100 W; and deposition temperature ranged from 150 to 350° C. The DOE experiments were used to determine what process parameters produced the optimal film for use as a passivation layer in a display device.

IGZO films were prepared by sputtering from an IGZO target using a Kurt Lesker Sputtering System with the wafer temperature less than 100° C. The sputtering pressure was around 6 mTorr with 10% oxygen and 90% argon as the gas mixture. The wafers were then annealed at 350° C. in $N_2$ ambient atmosphere for 2 hours. A Signatone four-point probe was used to estimate the sheet resistance after annealing. The sheet resistivity before and after annealing was measured by Keithley 6517A electrometer & 8009 fixture (with concentric ring electrodes contact).

Example 1: Deposition of Silicon-Containing Films Using Trisilylamine (TSA) and Ammonia ($NH_3$)

A number of silicon-containing films were deposited using trisylamine (USA) as precursor onto a 8 inch silicon substrate to see if any of the films would be suitable passivation layers in terms of density and hydrogen content. The composition of the films were measured by XPS and RBS/HFS and showed that the films were comprised of SixNy:Hz wherein the amount of silicon, nitrogen, and hydrogen or x, y, and z varied in atomic percentage depending upon the film. FIG. 1 shows the density versus H-content relationship for these barrier films deposited using TSA precursor.

Of the films deposited by TSA and shown in FIG. 1, the process conditions used to deposit the silicon-containing films having the highest density and lowest hydrogen content using TSA were as follows TSA flow (100-200 mgm), $NH_3$ flow (100 sccm), He (1000 sccm), Pressure (2 torr), RF (400 W), LF (0-100 W), and Temp (300° C.). Of the films shown in FIG. 1, the process conditions that produced the best TSA films in the data set had densities and hydrogen content of 2.4-2.5 g/cm³ and $2.0 \times 10^{22}$ to $2.2 \times 10^{22}$ $cm^{-3}$, respectively.

Figure 2:
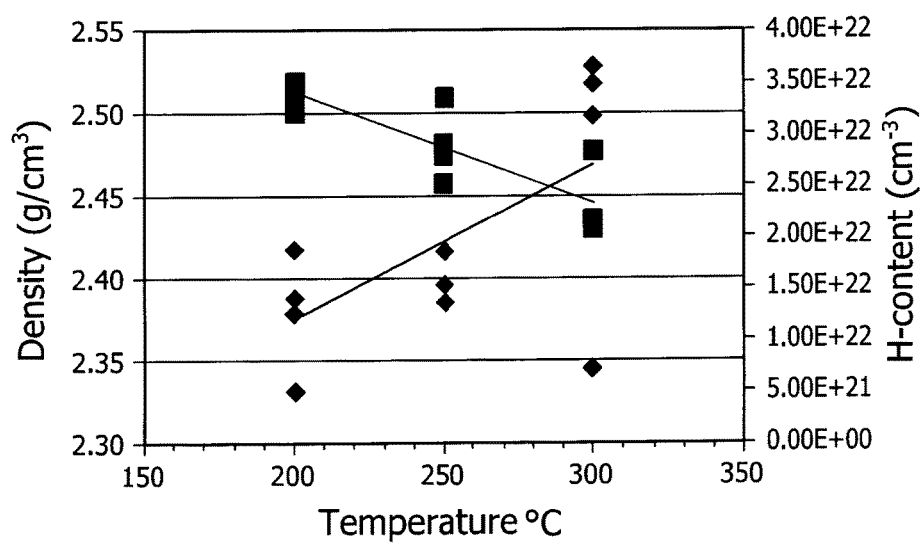
FIG. 2 shows the relationship between density and H-content for films deposited using TSA precursor at different temperature ranges (150-325° C.) where the diamonds on the Figure relate to density and the squares on the Figure relate to hydrogen content

For those data points shown in FIG. 1, FIG. 2 shows the relationship between density (left x-axis), deposition temperature (y-axis), and H-content (right x-axis) for various TSA deposited-films deposited at temperatures ranging from 200 to 300° C. The square data points represent the H-content and the diamond data points represent the density for each film deposited at three different deposition temperatures (e.g., 200, 250 and 300° C.). FIG. 2 generally shows that the density decreases as the H-content increases.

Figure 3:
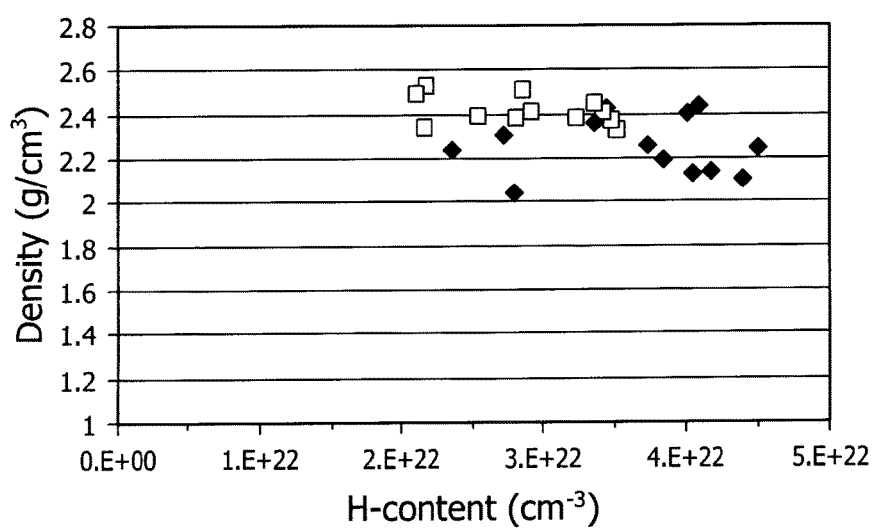
FIG. 3 shows the relationship between density and H-content for the films deposited at 300° C. using TSA as the precursor in Example 1 wherein the squares indicate data that was obtained using LF power and the diamonds indicate data that was obtained without LF power FIG. 4 provides a comparison of the moisture barrier performance for 100 nm thick silicon-containing films deposited from the following precursors: (A) (shown as diamonds on Figure) trisilylamine and $NH_3$ (density=2.36 g/cm³); (B) (shown as triangles on Figure) di-isopropylaminosilane and $NH_3$ (density=2.11 g/cm³) (C) (shown as squares on the Figure) dimethyldiethoxysilane and $H_2$ (density=1.95 g/cm³); and (D) (shown as circles on the Figure) trimethylsilane and $NH_3$ (density=1.88 g/cm³).

FIG. 3 shows the relationship between density and H-content for various TSA-deposited films all of which were deposited at 300° C. The data points represented by the diamonds and squares represents different process conditions. The diamond datapoints had no LF power whereas the square data points had LF power applied. The data shows that the depositions where LF power was applied generally had lower H content.

Comparative Example 2: Deposition of Silicon-Containing Films Using Dimethyldiethoxysilane (DMDES)

Silicon-containing films were deposited using dimethyldiethoxysilame (DMDES) as precursor. The composition of the films were measured by XPS and showed that the films were comprised of SixCyOa:Hz wherein the amount of silicon, carbon, oxygen and hydrogen or x, y, a, and z varied in atomic percentage depending upon the film. FIG. 1 shows the density versus H-content relationship for these silicon-containing films deposited using the DMDES precursor.

The process parameters that produced the highest density and lowest hydrogen content film shown in FIG. 1 using the DMDES precursor were the following: DMDES flow (200 mgm), $H_2$ flow (1000 sccm), He (300 sccm), Pressure (2 torr), RF (400 W), LF (100 W), and temperature (300° C.). Density and H-content for these films under these conditions were 2.0 g/cm$^3$ and 1.6×10$^{22}$ cm$^{-3}$, respectively. The DMDES deposited films did not have the requisite density or hydrogen content to be an optimal passivation layer for a display device comprising a metal oxide layer compared to the TSA deposited films.

Comparative Example 3: Deposition of Silicon-Containing Films Using Di-Isopropylaminosilane (DIPAS)

Silicon-containing films were deposited using di-isopropylaminosilane (DIPAS) as precursor. The films were analyzed by XPS and showed that they were comprised of SixCyNa:Hz wherein the amount of silicon, carbon, nitrogen and hydrogen or x, y, a, and z varied in atomic percentage depending upon the film. FIG. 1 shows the density versus H-content relationship for these silicon-containing films deposited using the DIPAS precursor.

The process parameters that produced the highest density and lowest hydrogen content film shown in FIG. 1 using the DIPAS precursor were the following: DIPAS flow (200 mgm), $NH_3$ flow (500 sccm), He (300 sccm), Pressure (2 torr), RF (800 W), LF (0 W), and temperature (300° C.). Density and H-content form the SiCNH films under these conditions were 2.3 g/cm$^3$ and 3.1×10$^{22}$ cm$^{-3}$, respectively. The DIPAS deposited films did not have the requisite density or hydrogen content to be an optimal passivation layer for a display device comprising a metal oxide layer compared to the TSA deposited films.

Comparative Example 4: Deposition of Silicon-Containing Films Using 1,4 Disiliabutane Silicon-containing films were deposited using 1,4 disilabutane as precursor. The films were analyzed by XPS and showed that they were comprised of SixCyNa:Hz wherein the amount of silicon, carbon, nitrogen and hydrogen or x, y, a, and z varied in atomic percentage depending upon the film. FIG. 1 shows the density versus H-content relationship for these silicon-containing films deposited using the 1,4 disilabutane precursor.

The process parameters that produced the highest density and lowest hydrogen content film shown in FIG. 1 using the 1,4 silabutane precursor were the following: 1,4 disilabutane flow (200 mgm), $NH_3$ flow (500 sccm), He (300 sccm), Pressure (2 torr), RF (1000 W), LF (100 W), and temperature (300° C.). Density and H-content fom the SiCNH films under these conditions were 2.3 g/cm$^3$ and 2.95E22 cm$^{-3}$, respectively. The 1,4 disilabutane deposited films did not have the requisite density or hydrogen content to be an optimal passivation layer for a display device comprising a metal oxide layer compared to the TSA deposited films.

Comparative Example 5: Deposition of Silicon-Containing Films Using a Mixture of TSA and Tri-Dimethylaminosilane (tDMAS)

Silicon-containing films were deposited using a mixture of TSA and tri-dimethylaminosilane (tDMAS) as precursor in varying ratios: 0, 0.60, 1.00 and 1.67. The films were analyzed by XPS and showed that they were comprised of SixCyNa:Hz wherein the amount of silicon, carbon, nitrogen and hydrogen or x, y, a, and z varied in atomic percentage depending upon the film. FIG. 1 shows the density versus H-content relationship for these silicon-containing films deposited using the mixture of the TSA and tDMAS precursor.

The process parameters that produced the highest density and lowest hydrogen content film shown in FIG. 1 using the TSA-tDMAS mixture were the following: TSA flow (150 mgm), tDMAS flow (250 mgm), $H_2$ flow (300 sccm), He (1000 sccm), Pressure (4 torr), RF (600 W), LF (0 W), and temperature (300° C.). Density and H-content form the SiCNH films under these conditions were 1.9 g/cm$^3$ and 3.7×10$^{22}$ cm$^{-3}$, respectively. Referring to FIG. 1, the TSA-tDMAS deposited films had lower density and higher hydrogen content metal oxide layer compared to the TSA deposited films and the tDMAS-$H_2$ deposited films. Further, while the tDMAS-$NH_3$ films had higher densities, their hydrogen content was also relatively higher.

Comparative Example 6: Deposition of Silicon-Containing Films Using Tri-Dimethylaminosilane (tDMAS) and Ammonia as Diluent Silicon-containing films were deposited using a tri-dimethylaminosilane (tDMAS) as precursor and $NH_3$ as a diluent using the general deposition conditions described above. The films were analyzed by XPS and showed that they were comprised of SixCyNa:Hz wherein the amount of silicon, carbon, nitrogen and hydrogen or x, y, a, and z varied in atomic percentage depending upon the film. FIG. 1 shows the density versus H-content relationship for these silicon-containing films deposited using the mixture of the tDMAS precursor and $NH_3$ as a diluent. Referring to FIG. 1, the tDMAS-$NH_3$ deposited films did not have the requisite density or hydrogen content to be an optimal passivation layer for a display device comprising a metal oxide layer compared to the TSA deposited films.

Comparative Example 7: Deposition of Silicon-Containing Films Using Tri-Dimethylaminosilane (tDMAS) and Hydrogen as Diluent Silicon-containing films were deposited using a mixture of tri-dimethylaminosilane (tDMAS) as precursor and $H_2$ as the diluents using the general deposition conditions described above. The films were analyzed by XPS and showed that they were comprised of SixCyNa:Hz wherein the amount of silicon, carbon, nitrogen and hydrogen or x, y, a, and z varied in atomic percentage depending upon the film. FIG. 1 shows the density versus H-content relationship for these silicon-containing films deposited using the mixture of the tDMAS precursor and $H_2$ as a diluent Referring to FIG. 1, the tDMAS-H$_2$ deposited films did not have the requisite density or hydrogen content to be an optimal passivation layer for a display device comprising a metal oxide layer compared to the TSA deposited films. Further, the tDMAS-H$_2$ deposited films did not perform as well as the tDMAS-NH$_3$ deposited films.

Example 8: Comparison of Moisture Barrier Performance for Silicon Containing Layers Deposited Using TEOS and TSA Passivation Layers In order to evaluate the relative moisture barrier performance of the silicon-containing films deposited in the above examples, a test was developed to measure this property. In this test, a less dense silicon dioxide (SiO$_2$) layer is first deposited using TEOS at 250° C. onto a silicon wafer under process conditions which render the film sensitive to moisture. When such films are exposed to atmospheric moisture, or alternatively for this comparative test an accelerated test which uses an atmosphere of 85% humidity at 85° C., the film stress changes from tensile to compressive. In this example and in FIG. 6, the dense TEOS and dense TSA films were compared to evaluate their relative moisture barrier performance. Both films were deposited on the less dense TEOS oxide film.

Figure 5:
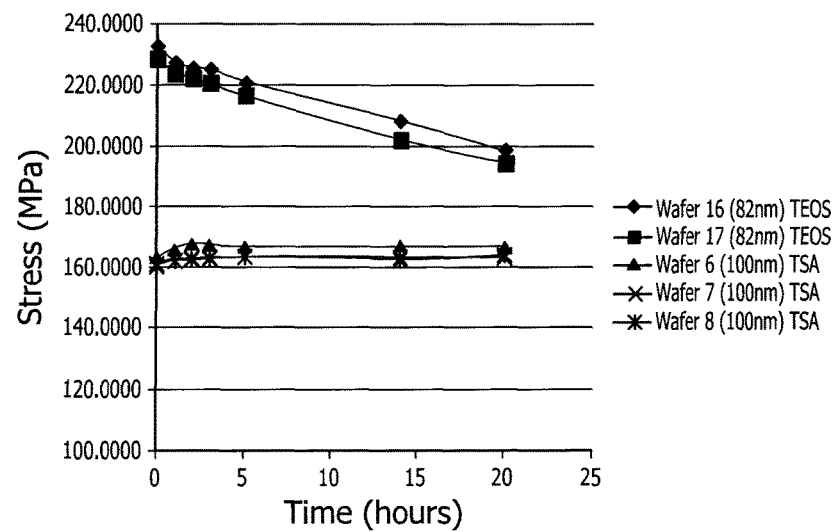
FIG. 5 provides a comparison of moisture barrier performance for 82 nm thick and 100 nm thick films deposited from TEOS and $O_2$ (or wafers 16 and 17 which had a density=2.25 g/cm³) or trisilylamine and $NH_3$ (or wafers 6, 7, and 8 which had a density=2.52 g/cm³), respectively.

To measure barrier performance, a thin layer of an exemplary silicon-containing film is deposited on top of the moisture sensitive SiO$_2$ layer and the stress of the film stack is measured in intervals of exposure to the accelerated 85% humidity, 85° C. and then in ambient conditions (e.g., air). The wafers were placed in a 85% humidity and 85° C. oven. The stress measurement was conducted in air. As shown in FIG. 5, all of the films deposited from TSA and NH$_3$ or wafers 6, 7, and 8, had a film density of 2.52 g/cm$^3$, and would provide the best passivation or barrier layer thereby not allowing any moisture into the underlying layer as evidenced by little if any change in the stress of the film stack.

Figure 4:
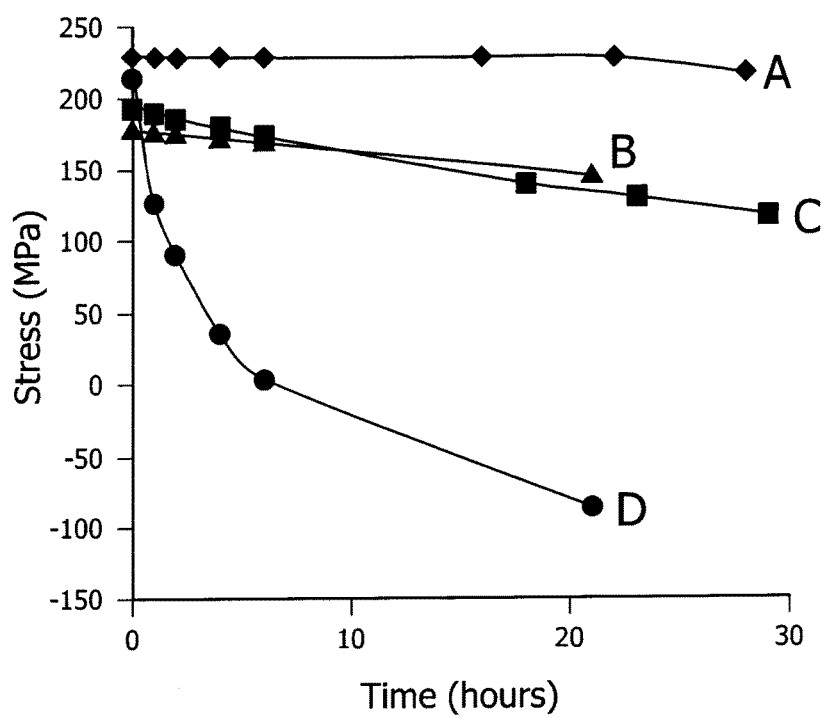
Figure 10:
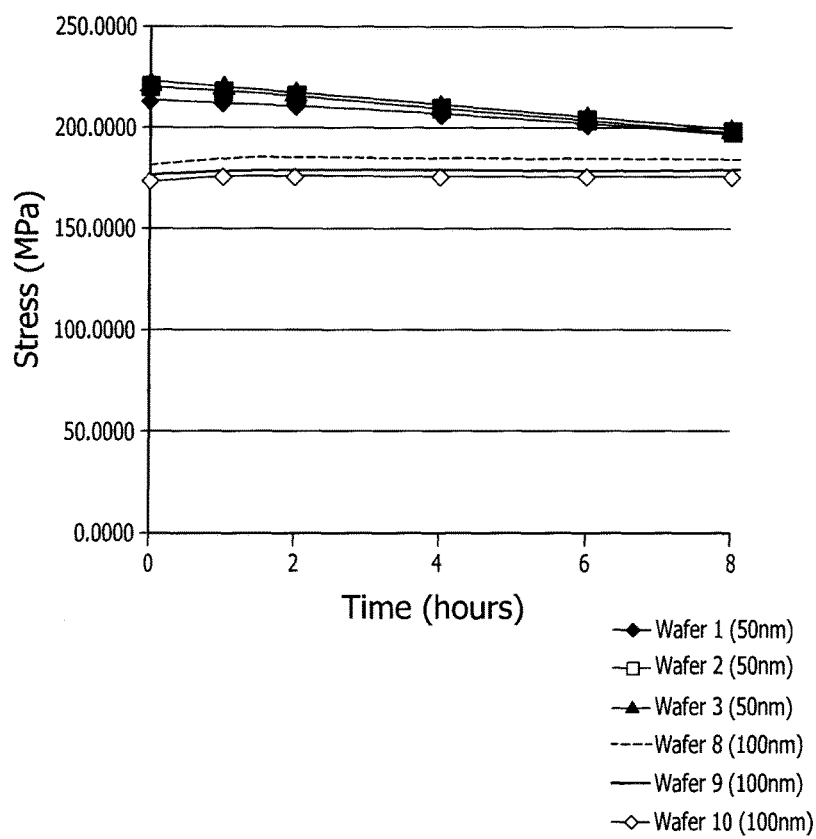
FIG. 10 provides the relationship between stress measured in megapascals and time measured in hours between different exemplary devices

FIG. 4 provides a comparison of the stress measured in (MPa) and time (hours) for 100 nm thick passivation layers comprised of the following: (A) (shown as diamonds on Figure) trisilylamine and NH$_3$ (density=2.36 g/cm$^3$); (B) (shown as triangles on Figure) di-isopropylaminosilane and NH$_3$; (C) (shown as squares on the Figure) dimethyldiethoxysilane and H$_2$ (density=1.95 g/cm$^3$); and (D) (shown as circles on the Figure) trimethylsilane and NH$_3$ (density=1.88 g/cm$^3$). The SiCN film, which was deposited from trimethylsilane and ammonia, shown as line (D) on the Figure, and has a density of 1.88 g/cm$^3$, did not exhibit a barrier performance as good as TSA as evidenced by a steep drop in the film stress (without a barrier in place the film stress drops from 250 to minus 100 MPa in the first 1 hour). The SiOC barrier film deposited from dimethyldiethyoxysilane and H$_2$ and has a density of 1.95 g/cm$^3$ and shown as line (C) on the Figure falls between the TSA films and the DMDES films in terms of barrier performance. The SiCN films deposited from DIPAS and NH$_3$ exhibit barrier performance similar to the film deposited from DMDES and H$_2$ and had a density of 2.11 g/cm$^3$. Additional test structures comprising a dual passivation layer structure comprising a silicon oxide layer deposited using TEOS and a silicon nitride layer deposited using TSA such as the structure shown in FIG. 6. The thickness of the TEOS-deposited silicon oxide layer was 850 nm and the thickness of the TSA-deposited silicon nitride layer was either 50 nm or 100 nm. The deposition conditions for test wafer 3 which had a 50 nm TSA-deposited silicon nitride was a power of 800 W, a pressure of 2 Torr, the flow rate of TSA 100 (mg/min.), a flow rate of helium of 1,000 sccm, a flow rate of ammonia of 100 sccm, and a deposition temperature of 100° C. The density of the TSA layer for test structure 3 was 2.342 g/cm$^3$. All of the test structures 50 nm and 100 nm were deposited in the same manner and have the same density that are shown in FIG. 10. The structures were subjected to accelerated weather testing which is indicative of hermeticity as described in this Example and the results are provided in FIG. 10. FIG. 10 shows that the test structures which had a thicker silicon nitride passivation layer or 100 nm layer were more stable and therefore had better hermeticity than structures having a thinner or 50 nm layer.

Figure 6:
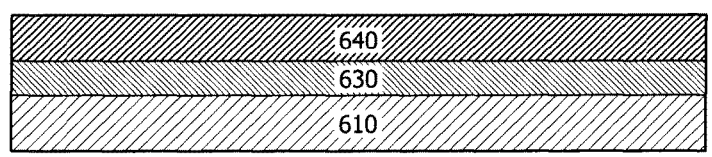
FIG. 6 provides an exemplary device structure that was used to evaluate impact on surface recombination velocity in Example 9.

Example 9: Evaluation of the Effect of Thickness of PECVD Silicon Oxide Atop In—Ga—Zn—O (IGZO) Metal Oxide Film Wherein Silicon Oxide Layer Further Topped with Silicon Nitride Layer FIG. 6 provides an exemplary structure of a display device comprising a IGZO metal oxide layer 610, a plasma-enhanced chemical vapor deposition (PECVD) silicon oxide layer 630 deposited by tetraethoxysilane (TEOS), and a silicon nitride layer 640 deposited by TSA and NH$_3$ to provide a density silicon nitride a 2.36 g/cm$^3$. The thickness of the silicon oxide layer 630 was varied from 0 to 250 nanometers (e.g., 15 nm, 60 nm, 115 nm, 185 nm, 200 nm, and 250 nm) to determine its impact on minority carrier lifetime. The thickness of the TSA silicon nitride layer was approximately 100 nm. The films were deposited according to the general deposition conditions described above and the following process conditions: (1) TEOS: Power=910 W, Pressure=8.2 Torr, TEOS flow=1000 mg/min, O$_2$ flow=1000 sccm, He flow=1000 sccm; and (2) TSA: Power=400 W, Pressure=4 Torr, TSA flow=200 mg/min, NH$_3$ flow=100 sccm, He flow=1000 sccm.

Figure 7:
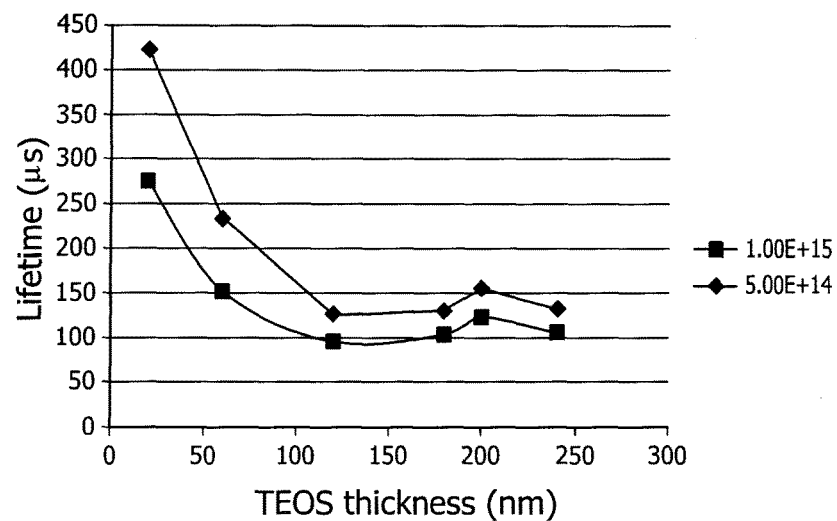
FIG. 7 provides the surface recombination velocity observed for High Resistivity Float Zone Silicon Passivated with TSA+$NH_3$ nitride and varying thickness of TEOS+$O_2$ PECVD Silicon Oxide deposited between the silicon substrate and the silicon nitride and described in Example 9.

FIG. 7 shows the impact of film thickness on the minority carrier lifetime in Float Zone high resistivity silicon (1000 Ω-cm) which was measured at two different levels of carrier injectors thereby producing the two lines of data shown in FIG. 7 (e.g., $1.00 \times 10^{-15}$ and $5.00 \times 10^{-14}$ cm$^{-3}$). At thin or no silicon oxide thicknesses, the hydrogen from the silicon nitride film diffuses to the surface of the silicon substrate and passivates surface defects thereby reducing the surface recombination velocity and thereby increases the minority carrier lifetimes. As the thickness of the silicon oxide layer is increased, hydrogen diffusion through the oxide film is reduced and the minority carrier lifetime is subsequently reduced. FIG. 7 shows that the preferred thickness to minimize hydrogen diffusion through the silicon oxide film ranges from about 150 to about 200 nm because the curve on the figure is flat when the thickness is 150 nm or greater. This thickness is sufficient to prevent hydrogen diffusion through the film. Films that are too thick may not be desirable from the perspective of the end user.

Example 10: Comparison of Passivation Layer Structure on IGZO Resistivity

The ability of silicon oxide to serve as a barrier to hydrogen diffusion from silicon nitride was evaluated on a metal oxide or IGZO substrate by comparing various passivation layer structures as shown in FIGS. 8a through 8f. The layered structures consisted of depositing silicon nitride films on a silicon substrate followed by depositing silicon oxide followed by sputtering of approximately 50 nm of IGZO as described above in the General Deposition Conditions. The film stack was exposed to a thermal anneal of 350° C. in an inert ambient for two hours as described herein. The subsequent resistivity of the film was measured to determine the degree to which the resistivity of the IGZO metal oxide was reduced. Table I provides the comparative data for the layered structures depicted in FIGS. 8a through 8e and are referred to as Examples 10a through 10f.

Example 10a

Figure 8A:
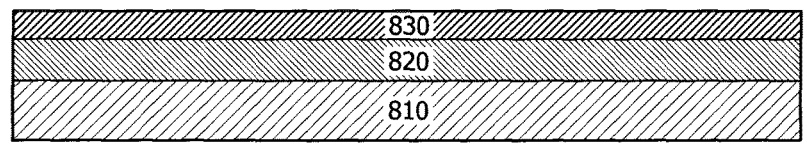
FIG. 8a through 8e provides exemplary structures that were used to measure the impact of passivation layers on IGZO resistivity and are described in Example 10.

A Si wafer substrate (810) upon which a 100 nm thermal oxide (820) was grown followed by sputtering 50 nm of amorphous IGZO (830) on its surface as depicted in FIG. 8a and was annealed at 350° C. for two hours in an inert ($N_2$) atmosphere. The post anneal resistance was measured and determined to be $1.1\times10^5\Omega/\square$.

Example 10b

Figure 8B:
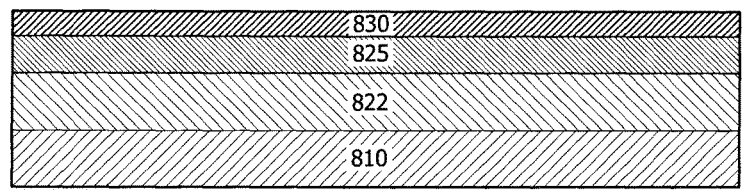

A Si wafer substrate (810) upon which a 200 nm PECVD silicon oxide layer (822) was deposited using TEOS, followed by a 100 nm PECVD silicon nitride layer from TSA precursor (825) and having a density of 2.52 g/cm³, followed by 50 nm of amorphous IGZO (830) sputtered on its surface as shown in FIG. 8b and was annealed at 350° C. for two hours in an inert ($N_2$) atmosphere. The post anneal resistance was measured and determined to be $1.9\times10^3\Omega/\square$.

Example 10c

Figure 8C:
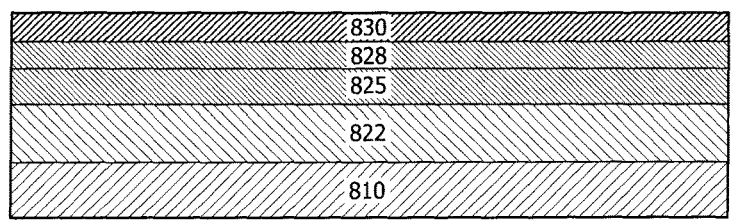

A Si wafer substrate (810) upon which a 200 nm PECVD silicon oxide layer (822) was deposited using TEOS, followed by a 100 nm PECVD silicon nitride layer from TSA precursor (825) and having a density of 2.52 g/cm³, followed by a 100 nm of PECVD Silicon Oxide (828) layer deposited using TEOS precursor, followed by 50 nm of amorphous IGZO (830) sputtered on its surface as shown in FIG. 8c and was annealed at 350° C. for two hours in an inert ($N_2$) atmosphere. The post anneal resistance was measured and determined to be $3.9\times10^3\Omega/\square$.

Example 10d

A Si wafer substrate (810) upon which a 200 nm PECVD silicon oxide buffer was deposited (822), followed by a 100 nm PECVD silicon nitride layer from TSA precursor (825) and having a density of 2.52 g/cm³, followed by a 200 nm of PECVD Silicon Oxide (828) layer deposited using TEOS precursor, and followed by 50 nm of amorphous IGZO (830) sputtered on its surface as shown in FIG. 8c and was annealed at 350° C. for two hours in an inert ($N_2$) atmosphere. The post anneal resistance was measured and determined to be $1.1\times10^4$ $\Omega$/cm. Example 10d differs from Example 10c in that the PECVD silicon oxide layer 828 is twice as thick or 200 nm as comparable layer 828 in Example 10c.

Example 10e

Figure 8D:
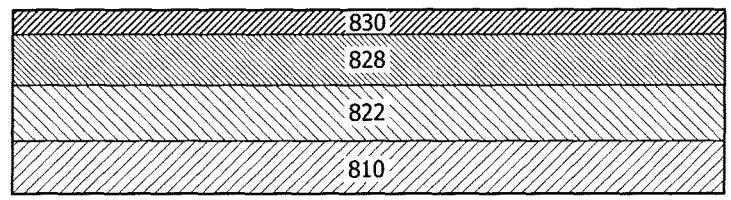

A Si wafer substrate (810) upon which a 200 nm PECVD silicon oxide layer (822) was deposited using TEOS at 400° C., followed by a 200 nm of PECVD TEOS based Silicon Oxide (828), followed by 50 nm of amorphous IGZO sputtered (830) on its surface as shown in FIG. 8d and was annealed at 350° C. for two hours in an inert ($N_2$) atmosphere. The post anneal resistance was measured and determined to be $1.0\times10^4\Omega/\square$.

Example 10f

Figure 8E:
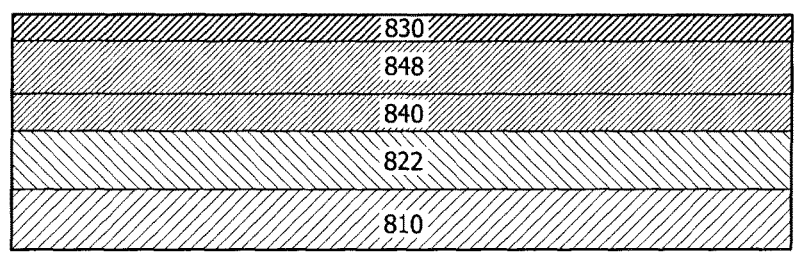

A Si wafer substrate (810) upon which a 200 nm PECVD silicon oxide layer (822) was deposited, followed by a 100 nm silane based PECVD silicon nitride layer (840), followed by a 200 nm of PECVD silane based Silicon Oxide (848), followed by 50 nm of amorphous IGZO sputtered (830) on its surface as shown in FIG. 8e and was annealed at 350° C. for two hours in an inert ($N_2$) atmosphere. The post anneal resistance was measured and determined to be $3.9\times10^3\Omega/\square$.

Referring to Table I, example 10a, or the structure shown in FIG. 8a, shows a thermal silicon oxide alone and represents the case of the highest purity silicon oxide containing an Oxygen to Silicon ratio of close to 2.0 or a fully stoichiometric $SiO_2$ film. This oxide had the lowest impact on resistivity of the IGZO film. Structures having no silicon oxide passivation layers, or Example 10b (structure depicted in FIG. 8b), was found to have the greatest reduction in IGZO sheet resistance from $1.1\times10^5$ to $1.9\times10^3\Omega/\square$. Films with 100 or 200 nm silicon oxide thicknesses or Examples 10c and 10d showed reduced reduction in IGZO resistivity. The film with PECVD silicon oxide and no silicon nitride passivation layer or Example 10e (structure depicted in FIG. 8d) showed a comparable reduction in resistivity to the 200 nm silicon oxide/silicon nitride film stack, suggesting an effective barrier to hydrogen diffusion but also indicating some contribution to the reduction in IGZO resistance from the PECVD silicon oxide film relative to the thermal oxide. Table 1 also provides the results obtained which used both silane gas as precursor for both silicon oxide and nitride in Example 10f (structure depicted in FIG. 8e), which is the current industry standard and is used, for example, in the Liu et al reference described herein. Example 10f shows that the selection of the passivation layer(s) is important because the metal oxide does not remain in a semiconductive state (e.g., having a resistance measurement between $1\times10^4$ and $1\times10^5$ ($\Omega/\square$)) to be effective as a display device. Results indicated less impact on IGZO resistance for an optimized organosilane based oxide relative to a silane based oxide at 300° C.

TABLE I

Impact of Film Stack Composition on IGZO Sheet Resistance.

| Film Stack | Resistance ($\Omega/\square$) |
|---|---|
| Example 10a: Si/Thermal Silicon Oxide/IGZO | $1.1 \times 10^5$ |
| Example 10b: Si/PECVD Silicon Nitride/IGZO | $1.9 \times 10^3$ |
| Example 10c: Si/PECVD Silicon Nitride/100 nm PECVD Silicon Oxide/IGZO | $3.9 \times 10^3$ |
| Example 10d: Si/PECVD Silicon Nitride/200 nm PECVD Silicon Oxide/IGZO | $1.1 \times 10^4$ |
| Example 10e: Si/PECVD 200 nm Silicon Oxide/IGZO | $1.0 \times 10^4$ |
| Example 10f: Si/PECVD Silicon Nitride ($SiH_4$)/Silicon Oxide ($SiH_4$)/IGZO | $3.9 \times 10^3$ |

Example 11: Deposition of Thin $SiO_2$ Films Using Triethylsilane (3ES) with High Density Process conditions for the 3ES silicon oxide films were screened using a design of experiment (DOE) methodology summarized below: precursor flow from 100 to 800 sccm;

O$_2$/He flow from 20 to 100 sccm, pressure from 0.75 to 10 torr; RF power (13.56 MHz) 0.5-3 W/cm$^2$; Low-frequency (LF) power 0 to 100 W; and deposition temperature ranged from 100° C. to 150° C. The DOE experiments were used to determine what process parameters produced the optimal film for use as a gate insulating layer in a display device.

SiO$_2$ films were deposited using the precursor 3ES at lower deposition temperatures, such as 100° C., 125° C. and 150° C. then described above. By optimizing the process parameters, such as precursor flow, chamber pressure and power density, etc., high density and thin SiO$_2$ films were obtained. Table II shows a summary of the three process conditions used for 3ES film deposited at different temperatures 100° C., 125° C. and 150° C., as well as certain film properties, such as thickness, k value and density which were measured using the methods described herein in the general deposition conditions. In general, the films deposited using 3ES had a thickness less than 200 nm, a k value between 4 to 5, and a density of 2.2 g/cm$^3$ or greater. This example shows that 3ES is a suitable precursor candidate to provide a high density silicon oxide layer which can be used, for example, as an additional passivation layer along with a TSA-deposited silicon nitride passivation layer such as those embodiments illustrated, for example, in FIG. 9b.

TABLE II

Summary of process conditions used for 3ES film deposited at different temperatures 100° C., 125° C. and 150° C. and the film properties

| Process conditions | 3ES 100° C. | 3ES 125° C. | 3ES 150° C. |
| --- | --- | --- | --- |
| Precursor flow (sccm) | 27 | 48 | 27 |
| He (carrier, sccm) | 1000 | 1000 | 1000 |
| O$_2$ (sccm) | 1000 | 1000 | 1000 |
| Pressure (torr) | 9.2 | 9.2 | 9.2 |
| Spacing (mils) | 500 | 500 | 500 |
| Power density (W/cm$^2$) | 1.75 | 2.5 | 2.5 |
| Film thickness (nm) | 165 | 113 | 173 |
| Film Density (g/cm$^3$) | 2.26 | 2.29 | 2.28 |
| K value | 4.67 | 4.62 | 4.42 |

Example 12: Deposition of Thin SiO$_2$ Films Using Diethylsilane (2ES) with High Density Process conditions for the 2ES silicon oxide films were screened at temperatures below 200° C. using a design of experiment (DOE) methodology summarized below: typical precursor flow rates were 25 to 150 sccms, plasma power density was 0.5-3 W/cm$^2$, and pressure was 0.75-12 torr.

The SiO$_2$ films were also deposited at a deposition temperature of 100° C. using 2ES. By optimizing the process parameters, such as precursor flow, chamber pressure and power density, and other process conditions, high density and thin SiO$_2$ films were obtained. Table III shows a summary of the process conditions used for 2ES film deposited at 100° C. as well as the certain film properties, such as thickness, k value and density which were obtained using the methods described herein. The film had a thickness less than 200 nm and a density higher than 2.2 g/cm$^3$. This example shows that 2ES is a suitable precursor candidate to provide a high density silicon oxide layer which can be used, for example, as an additional passivation layer along with a TSA-deposited silicon nitride passivation layer such as those embodiments illustrated, for example, in FIG. 9b.

TABLE III

Summary of process conditions used for 2ES-deposited SiO2 film at 100° C. and film properties.

| Process conditions | 2ES 100° C. |
| --- | --- |
| Precursor flow (sccm) | 38 |
| He (carrier, sccm) | 1000 |
| O$_2$ (sccm) | 1000 |
| Pressure (Torr) | 10 |
| Spacing (mils) | 500 |
| Power density (W/cm$^2$) | 1.5 |
| Film thickness (nm) | 195 |
| Density (g/cm$^3$) | 2.21 |
| K value | 5.05 |

Example 13: Deposition of Thin SiO$_2$ Films Using 3ES at 100° C. with High Density The present example is used to show the deposition of thin and high density SiO$_2$ film using 3ES provides a wide process window. Table IV provides the process conditions for two 3ES deposited, SiO$_2$ films and film properties at different precursor flow, 29 sccm and 68 sccm. Although the table shows a wide range of deposition rates, high density films were obtained. This example shows that 3ES is a suitable precursor candidate to provide a high density silicon oxide layer which can be used, for example, as an additional passivation layer along with a TSA-deposited silicon nitride passivation layer such as those embodiments illustrated, for example, in FIG. 9b.

TABLE IV

Summary of Process Conditions for 100° C. 3ES Depositions

| Process conditions | 100° C. | 100° C. |
| --- | --- | --- |
| Precursor flow (sccm) | 29 | 68 |
| He (carrier, sccm) | 1000 | 1000 |
| O$_2$ (sccm) | 1000 | 1000 |
| Pressure (Torr) | 9.2 | 9.2 |
| Spacing (mils) | 500 | 500 |
| Power density (W/cm$^2$) | 2.5 | 2.5 |
| Deposition rate (nm/min) | 27 | 89 |
| Film thickness (nm) | 160 | 222 |
| K value | 4.77 | 5.07 |
| Density (g/cm$^3$) | 2.26 | 2.23 |

Example 14: Compositional Data of Thin SiO$_2$ Films Deposited Using 3ES at 100° C. and 150° C.

XPS was used to exam the carbon concentration in the film. The relative atomic percentage is measured at the surface and after 50 nm sputtering. Table V shows the process conditions and film properties of two 3ES films deposited at 100° C. and 150° C. Table VI provides the XPS data of the films. No carbon was detected in the bulk film and the O/Si ratio of the film was very close to 2.0 or stoichiometric. This example shows that 3ES is a suitable precursor candidate to provide a high density silicon oxide layer which can be used, for example, as an additional passivation layer along with a TSA-deposited silicon nitride passivation layer such as those embodiments illustrated, for example, in FIG. 9b.

TABLE V

Summary of process conditions and film properties of 3ES films.

| Process conditions | 3ES 150° C. | 3ES 100° C. |
|---|---|---|
| Precursor flow (sccm) | 68 | 50 |
| He (carrier, sccm) | 1000 | 1000 |
| $O_2$ (sccm) | 1000 | 1000 |
| Pressure (Torr) | 9.2 | 9 |
| Spacing (mils) | 500 | 700 |
| Power density (W/cm$^2$) | 2.5 | 2.0 |
| Film thickness (nm) | 210 | 206 |
| K value | 4.69 | 4.84 |
| Density (g/cm$^3$) | 2.248 | 2.27 |

TABLE VI

XPS data of 3ES films deposited Using Table 5 Process Conditions.

| Sample ID | Location | Condition | O | N | C | Si | O/Si |
|---|---|---|---|---|---|---|---|
| 3ES 150° C. | A | As Received | 62.0 | ND | 8.5 | 29.5 | 2.10 |
| | | After 500 Å Sputter | 66.8 | ND | ND | 33.2 | 2.01 |
| | B | As Received | 63.0 | ND | 9.4 | 27.7 | 2.28 |
| | | After 500 Å Sputter | 67.3 | ND | ND | 32.7 | 2.06 |
| 3ES 100° C. | A | As Received | 57.5 | ND | 15.7 | 26.9 | 2.1 |
| | | After 500 Å Sputter | 66.7 | ND | | 33.3 | 2.0 |
| | B | As Received | 61.4 | ND | 9.4 | 29.3 | 2.1 |
| | | After 500 Å Sputter | 66.5 | ND | | 33.5 | 2.0 |

Example 15: Deposition of Diethylsilane (2ES) at Deposition Temperatures of 250° C. and 350° C.

Silicon oxide films were deposited from the silicon precursor 2ES and 3ES SiO$_2$ films were deposited at different temperature and process conditions using the general deposition conditions described above and the following process conditions: precursor flow of 107 sccm; helium carrier gas flow of 1000 sccm; oxygen (O$_2$) gas flow of 1100 sccm, pressure of 8.2 torr; spacing of 500 mils, and power density of W/cm$^2$.

The H-content in atomic % and measured by RBS for the DES deposited films which were deposited at a above process conditions at deposition temperature of 350° C. and 250° C. were 2.0% (density of 2.25 g/cm$^3$) and 2.8% (density of 2.26 g/cm$^3$), respectively. This shows that both DES deposited films had very low total hydrogen content (<5%) as measured by RBS/HFS. This is also confirmed by a FTIR analysis of these films which showed no detectible Si—H and very minimal Si—OH bonding. This example shows that 2ES is a suitable precursor candidate to provide a high density and low hydrogen content silicon oxide layer which can be used, for example, as an additional passivation layer along with a TSA-deposited silicon nitride passivation layer such as those embodiments illustrated, for example, in FIG. 9b.

The examples and embodiments described herein, are exemplary of numerous embodiments that may be made. It is contemplated that numerous materials other than those specifically disclosed may be made. Numerous other configurations of the process may also be used, and the materials used in the process may be elected from numerous materials other than those specifically disclosed.

The invention claimed is:

1. A method for depositing a silicon-containing layer on a surface of a substrate, the method comprising:
providing the substrate in a reaction chamber wherein the substrate comprises a transparent conductive metal oxide layer;
depositing via a PECVD process a silicon oxide layer on top of the transparent conductive metal oxide layer, wherein the silicon oxide layer is deposited from a tetraethoxysilane precursor at a temperature of from 80° C. to 400° C., and wherein the silicon oxide layer has a thickness of from about 2 nm to 200 nm and a density of about 2.2 g/cm$^3$ or greater;
depositing via a vapor deposition process a silicon containing-layer by
i. introducing into the reaction chamber at least one silicon precursor selected from the group consisting of:
trisilylamine (TSA);
a dialkylaminosilane having a formula of $R^1R^2NSiH_3$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ is independently selected from a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein $R^1$ and $R^2$ are linked to form a ring or $R^1$ and $R^2$ are not linked to form a ring;
organoaminosilane having a formula of $(R^1R^2N)_n SiH_{4-n}$ wherein $R^1$ is independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ is independently selected from a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein $R^1$ and $R^2$ are linked to form a ring or $R^1$ and $R^2$ are not linked to form a ring; and n is 2, 3, or 4;
an isocyanatosilane selected from the group consisting of tetra(isocynato)silane and tri(isocynato)silane;
an alkylazidosilanes having the formula of $R^1R^2R^3SiN_3$ wherein $R^1$, $R^2$, and $R^3$ are independently selected from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group;
ii. introducing into the reaction chamber a source selected from the group consisting of an oxygen source, a nitrogen-containing source, and a combination thereof; and
iii. applying energy to the at least one silicon precursor and the source to deposit the silicon containing layer on the at least one surface of the silicon oxide layer at one or more temperatures ranging from about 25° C. to 350° C. to form a double passivation layer on top of the transparent conductive metal oxide layer, wherein the vapor deposition process is selected from the group consisting of plasma enhanced chemical vapor deposition (PECVD), atomic layer deposition (ALD), and plasma enhanced atomic layer deposition (PEALD), wherein the silicon containing layer comprises silicon nitride having a transparency of greater than about 90% at 400-700 nanometers when measured by UV-visible light spectrometry, and wherein the silicon nitride has a density of 2.4 g/cm$^3$ or greater and a hydrogen content of $4 \times 10^{22}$ cm$^{-3}$ or less.

2. The method of claim 1 wherein the conductive metal oxide layer comprises at least one selected from the group consisting of Indium Gallium Zinc Oxide (IGZO), a-IGZO (amorphous indium gallium zinc oxide), Indium Tin Zinc Oxide (ITZO), Aluminum Indium Oxide (AlInOx), Zinc Tin Oxide (ZTO), Zinc Oxynitride (ZnON), Magnesium Zinc Oxide, zinc oxide (ZnO), InGaZnON, ZnON, ZnSnO, CdSnO, GaSnO, TiSnO, CuAlO, SrCuo, LaCuOS, and combinations thereof.

3. The method of claim 1 wherein the silicon oxide layer comprises a hydrogen content of 5 atomic % or less.

4. The method of claim 1 wherein the silicon-containing layer comprises at least one or more of the following properties: a density greater of about 1.9 g/cm$^3$ or greater, a hydrogen content of $4 \times 10^{22}$ cm$^{-3}$ or less, and a transparency >90% at 400-700 nm.

5. The method of claim 1 wherein the oxygen source is selected from the group consisting of water (H$_2$O), oxygen (O$_2$), oxygen plasma, ozone (O$_3$), NO, N$_2$O, carbon monoxide (CO), carbon dioxide (CO$_2$) and combinations thereof.

6. The method of claim 1 wherein the nitrogen-containing source is selected from the group consisting of ammonia, hydrazine, monoalkylhydrazine, dialkylhydrazine, nitrogen, nitrogen/hydrogen, ammonia plasma, nitrogen plasma, nitrogen/hydrogen plasma, NF$_3$, and mixtures thereof.

7. The method of claim 1 wherein the temperature of the depositing step ranges from about 150° C. to about 350° C.

8. The method of claim 1 wherein the vapor deposition process is plasma enhanced chemical vapor deposition (PECVD).

9. The method of claim 1 wherein the silicon precursor comprises trisilylamine.

10. The method of claim 1 wherein the silicon-containing layer comprises a single passivation layer.

* * * * *